(12) United States Patent
Ma et al.

(10) Patent No.: US 12,371,316 B2
(45) Date of Patent: Jul. 29, 2025

(54) MICRO-NANO CHANNEL STRUCTURE, SENSOR AND MANUFACTURING METHOD THEREOF, AND MICROFLUIDIC DEVICE

(71) Applicant: BOE TECHNOLOGY GROUP CO., LTD., Beijing (CN)

(72) Inventors: Xiaochen Ma, Beijing (CN); Guangcai Yuan, Beijing (CN); Ce Ning, Beijing (CN); Xin Gu, Beijing (CN); Xiao Zhang, Beijing (CN); Chao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/517,694

(22) Filed: Nov. 22, 2023

(65) Prior Publication Data
US 2024/0092628 A1 Mar. 21, 2024

Related U.S. Application Data

(63) Continuation of application No. 16/753,362, filed as application No. PCT/CN2019/081307 on Apr. 3, 2019, now Pat. No. 11,905,163.

(51) Int. Cl.
*B81B 1/00* (2006.01)
*B01L 3/00* (2006.01)
*B81C 1/00* (2006.01)

(52) U.S. Cl.
CPC ........ *B81B 1/002* (2013.01); *B01L 3/502715* (2013.01); *B81C 1/00071* (2013.01);
(Continued)

(58) Field of Classification Search
CPC ...... B81B 2203/03–0361; B81B 1/002; B81B 2203/0338; B81C 1/00071; B81C 1/00119
See application file for complete search history.

(56) References Cited

U.S. PATENT DOCUMENTS

| 7,906,026 | B2 | 3/2011 | Sibbett | |
|---|---|---|---|---|
| 2005/0103713 | A1 | 5/2005 | Ramsey et al. | |
| 2007/0077771 | A1 | 4/2007 | Plissonnier et al. | |
| 2008/0242556 | A1 | 10/2008 | Cao et al. | |
| 2011/0272789 | A1 | 11/2011 | Wang et al. | |
| 2012/0244635 | A1* | 9/2012 | Austin | B82Y 30/00 422/69 |

(Continued)

FOREIGN PATENT DOCUMENTS

| CN | 1890560 A | 1/2007 |
|---|---|---|
| CN | 102303843 A | 1/2012 |

(Continued)

OTHER PUBLICATIONS

Extended European Search Report in corresponding Application No. 19858692.7, mailed Oct. 17, 2022.
(Continued)

*Primary Examiner* — Moazzam Hossain
(74) *Attorney, Agent, or Firm* — LEASON ELLIS LLP

(57) ABSTRACT

A micro-nano channel structure, a method for manufacturing the micro-nano channel structure, a sensor, a method for manufacturing the sensor, and a microfluidic device are provided. The micro-nano channel structure includes: a base substrate; a base layer, on the base substrate and including a plurality of protrusions; a channel wall layer, on a side of the plurality of the protrusions away from the base substrate, the channel wall layer has a micro-nano channel; a recessed portion is provided between adjacent protrusions of the plurality of the protrusions, an orthographic projection of the micro-nano channel on the base substrate is located within an orthographic projection of the recessed portion on the base substrate. The micro-nano channels have a high resolution or an ultra-high resolution, and have different sizes and shapes.

19 Claims, 10 Drawing Sheets

(52) U.S. Cl.
CPC ... *B01L 2300/0645* (2013.01); *B81B 2201/05* (2013.01); *B81B 2203/0338* (2013.01); *B81C 2201/0111* (2013.01); *B81C 2201/036* (2013.01)

(56) References Cited

U.S. PATENT DOCUMENTS

| | | | |
|---|---|---|---|
| 2015/0183636 A1* | 7/2015 | Akiba | B81B 3/0051 257/417 |
| 2017/0313580 A1 | 11/2017 | Cao et al. | |
| 2017/0363588 A1* | 12/2017 | Feyh | G01N 30/6095 |
| 2020/0194553 A1 | 6/2020 | Ma et al. | |

FOREIGN PATENT DOCUMENTS

| | | | |
|---|---|---|---|
| CN | 102369059 A | | 3/2012 |
| CN | 102621805 A | * | 8/2012 |
| CN | 102874743 A | | 1/2013 |
| CN | 103305402 A | | 9/2013 |
| CN | 109060922 A | | 12/2018 |

OTHER PUBLICATIONS

Final Office Action for related U.S. Appl. No. 16/753,362, dated May 11, 2023.

Non-Final Office Action for related U.S. Appl. No. 16/753,362, dated Jan. 4, 2023.

Restriction Requirement for related U.S. Appl. No. 16/753,362, dated Sep. 16, 2022.

International Search Report and Written Opinion and English Translation for related International Application No. PCT/CN2019/081307, dated Dec. 27, 2019.

Notice of Allowance for related U.S. Appl. No. 16/753,362, dated Aug. 25, 2023.

* cited by examiner

MICRO-NANO CHANNEL STRUCTURE, SENSOR AND MANUFACTURING METHOD THEREOF, AND MICROFLUIDIC DEVICE

CROSS REFERENCE TO RELATED APPLICATIONS

This patent application is a continuation of U.S. application Ser. No. 16/753,362, filed on Apr. 3, 2020, which is a national stage application of International Application NO. PCT/CN2019/081307 filed on Apr. 3, 2019. All the aforementioned patent applications are hereby incorporated by reference in their entireties.

TECHNICAL FIELD

Embodiments of the present disclosure relate to a micro-nano channel structure, a manufacturing method of the micro-nano channel structure, a sensor, a manufacturing method of the sensor and a microfluidic device.

BACKGROUND

With increasing application of micro-nano fluids (liquid, gas, or a combination of liquid and gas) in fields of physics, chemistry, biochemistry, life science and technology, nano-science technology and engineering, research related to micro-nano fluid systems has also become a hot topic. At present, the micro-nano fluid systems have achieved many important results in single molecule analysis, trace substance reaction, trace substance analysis, gene sequencing, single protein detection, stretch manipulation of DNA molecules, drug release technology, battery technology, laser technology, and inkjet printing.

A micro-nano channel is generally defined as a fluid flow channel with at least one dimension less than two hundred nanometers. Physical and chemical characteristics of fluid at the micro-nano size are very different from those of the fluid at the macro-size. Fluid flowing in the micro-nano channel with a micro-nano size has special physical and chemical properties, and the fluid with the special physical and chemical properties makes an inestimable contribution to the development of related subject.

SUMMARY

At least one embodiment of the present disclosure provides a micro-nano channel structure, and the micro-nano channel structure includes: a base substrate; a base layer, on the base substrate and comprising a plurality of protrusions; and a channel wall layer, on a side of the plurality of the protrusions away from the base substrate, and the channel wall layer has a micro-nano channel; a recessed portion is provided between adjacent protrusions of the plurality of the protrusions, and an orthographic projection of the micro-nano channel on the base substrate is located within an orthographic projection of the recessed portion on the base substrate.

For example, in the micro-nano channel structure provided by at least one embodiment of the present disclosure, a cross section of at least one of the plurality of the protrusions in a plane substantially perpendicular to an extending direction of the recessed portion is semicircular, triangular, trapezoidal, or irregular in shape.

For example, in the micro-nano channel structure provided by at least one embodiment of the present disclosure, a ratio of a maximum depth and a maximum width of the recessed portion in a plane substantially perpendicular to an extending direction of the recessed portion is from 1 to 5.

For example, the micro-nano channel structure provided by at least one embodiment of the present disclosure comprising: a plurality of recessed portions and a plurality of micro-nano channels, maximum widths of adjacent recessed portions in a plane substantially perpendicular to an extending direction of the recessed portion are different from each other, and/or in the plane substantially perpendicular to the extending direction of the recessed portion, heights of adjacent protrusions of the plurality of the protrusions are different from each other, so that cross-sectional areas of the adjacent micro-nano channels are different from each other.

For example, in the micro-nano channel structure provided by at least one embodiment of the present disclosure, in the plane substantially perpendicular to the extending direction of the recessed portion and in a same direction, the maximum widths of the adjacent recessed portions are gradually decreased, and the heights of adjacent protrusions among the plurality of the protrusions are gradually decreased, so that the sizes of the cross-sectional areas of the adjacent micro-nano channels are gradually decreased.

For example, in the micro-nano channel structure provided by at least one embodiment of the present disclosure, in the plane substantially perpendicular to the extending direction of the recessed portion and in a same direction, the maximum widths of the adjacent recessed portion are increased firstly and then decreased, the heights of the adjacent protrusions among the plurality of the protrusions are increased firstly and then decreased, so that the sizes of the cross-sectional areas of the adjacent micro-nano channels are increased firstly and then decreased.

For example, in the micro-nano channel structure provided by at least one embodiment of the present disclosure, orthographic projections of the plurality of the micro-nano channels on the base substrate are located within the orthographic projections of the plurality of the recessed portions directly facing towards the micro-nano channels on the base substrate respectively.

For example, in the micro-nano channel structure provided by at least one embodiment of the present disclosure, a maximum width of the micro-nano channel in a plane substantially perpendicular to an extending direction of the recessed portion is from 3 nanometers to 50 micrometers.

For example, in the micro-nano channel structure provided by at least one embodiment of the present disclosure, a material of the base layer comprises a conductive material.

For example, in the micro-nano channel structure provided by at least one embodiment of the present disclosure, the base layer further comprises a base portion being in contact with the plurality of the protrusions.

For example, in the micro-nano channel structure provided by at least one embodiment of the present disclosure, on a plane substantially perpendicular to an extending direction of the recessed portion, sides, close to each other, of adjacent protrusions of the plurality of the protrusions are connected with each other or spaced apart from each other.

For example, in the micro-nano channel structure provided by at least one embodiment of the present disclosure, the micro-nano channel is a semi-closed micro-nano channel.

For example, in the micro-nano channel structure provided by at least one embodiment of the present disclosure, the micro-nano channel is a closed micro-nano channel.

At least one embodiment of the present disclosure further provides a sensor, and the sensor includes any one of the micro-nano channel structures mentioned above and a sensing circuit.

For example, in the sensor provided by at least one embodiment of the present disclosure, the base layer in the micro-nano channel structure is made of a conductive material, and the base layer is configured to be a sensing electrode of the sensor.

At least one embodiment of the present disclosure further provides a microfluidic device, the microfluidic device includes any one of the micro-nano channel structures mentioned above.

For example, in the microfluidic device provided by at least one embodiment of the present disclosure, the base layer in the micro-nano channel structure is made of a conductive material, and the base layer is a control electrode configured for controlling transport of materials in the micro-nano channel structure.

At least one embodiment of the present disclosure further provides a method for manufacturing a micro-nano channel structure, and the manufacturing method includes: providing a base substrate; applying a base material on the base substrate; performing a treatment on the base material to form a base layer, in which the base layer comprises a plurality of protrusions; and forming a channel wall layer on a side of the plurality of the protrusions away from the base substrate, in which the channel wall layer is provided with a micro-nano channel, a recessed portion is provided between adjacent protrusions of the plurality of the protrusions, and an orthographic projection of the micro-nano channel on the base substrate is located within an orthographic projection of the recessed portion on the base substrate.

For example, in the manufacturing method provided by at least one embodiment of the present disclosure, the performing the treatment on the base material to form the base layer comprises: embossing the base material to form a first base pattern; and performing a deforming treatment on the first base pattern to form the base layer.

For example, in the manufacturing method provided by at least one embodiment of the present disclosure, the performing the deforming treatment on the first base pattern comprises: performing the deforming treatment on the first base pattern while forming the channel wall layer.

For example, in the manufacturing method provided by at least one embodiment of the present disclosure, the performing the deforming treatment on the first base pattern comprises: performing a heat treatment, performing a laser irradiation treatment, or performing a plasma bombardment treatment.

For example, in the manufacturing method provided by at least one embodiment of the present disclosure, the forming the channel wall layer on the side of the plurality of the protrusions away from the base substrate comprises: sputtering a channel wall layer material on the first base pattern, or sputtering a channel wall layer material on the base layer.

For example, the manufacturing method provided by at least one embodiment of the present disclosure further includes: controlling a size and a shape of the micro-nano channel by controlling a duration or power of sputtering a channel wall layer material.

For example, in the manufacturing method provided by at least one embodiment of the present disclosure, sputtering the channel wall layer material at room temperature under a sputtering atmosphere including oxygen and argon, a sputtering power is from 2 kw to 5 kw, a sputtering pressure is from 0.05 pa to 0.8 pa.

For example, in the manufacturing method provided by at least one embodiment of the present disclosure, a plurality of recessed portions and a plurality of micro-nano channels are provided, and the treatment is performed on the base material, such that in a plane substantially perpendicular to an extending direction of the recessed portion, maximum widths of adjacent recessed portions are different from each other, heights of adjacent protrusions of the plurality of the protrusions are different from each other, and cross-sectional areas of the adjacent micro-nano channels are different from each other.

At least one embodiment of the present disclosure further provides a method for manufacturing a sensor, and the method includes: forming a sensing circuit and any one of the micro-nano channel structures mentioned above.

For example, in the manufacturing method provided by at least one embodiment of the present disclosure, the base layer in the micro-nano channel structure is made of a conductive material, and the base layer is a sensing electrode of the sensor.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

REFERENCE NUMERALS

Figure 1:
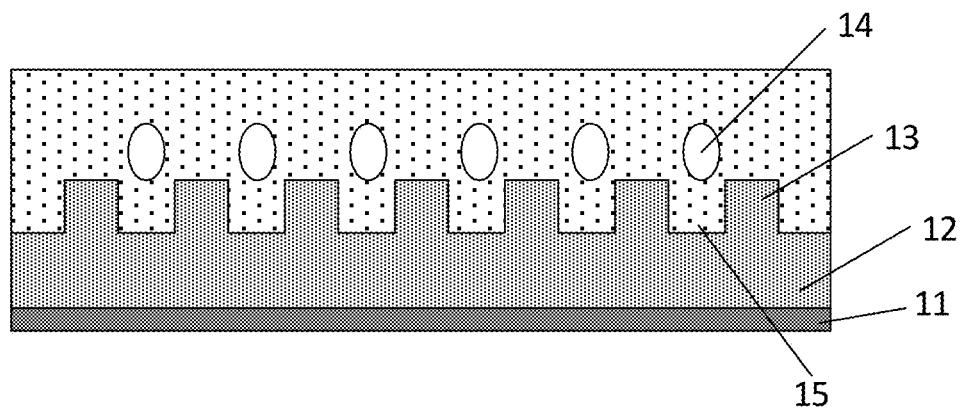
FIG. 1 is a cross-sectional structure schematic diagram of a micro-nano channel.

11—base; 12—foundation layer; 13—foundation structure; 14—micro-nano channel; 15—gap; 16—foundation layer film; 17—embossing plate; 20—micro-nano channel structure; 21—base substrate; 22—base layer; 221—base portion; 23—channel wall layer; 231—first channel wall; 232—second channel wall; 24—micro-nano channel; 241—open portion; 26—protrusion; 27—recessed portion; 28—base material; 29—first base pattern; 30—sensing circuit; 40—microfluidic device; 41—transistor; 42—light sensor.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

Instruments such as micro-nano flow control chips based on micro-nano channel structures conform to development trends of miniaturization, integration and portability of analytical instruments, and the instruments have been widely used in the fields of biomedical research, drug synthesis screening, environmental monitoring and protection, health quarantine, judicial identification, and detection of biological reagents. For example, the micro-nano flow control chips based on the micro-nano channel structures have successfully implemented the function of sensing signals such as biological signals. For example, gene sequencing, single protein detection, and so on. However, a process for manufacturing the micro-nano channel structure is usually complicated, the equipment used is expensive, the process cost is high, the production efficiency is low, and the scalability is poor. For example, the process of manufacturing the micro-nano channel structure involves the deposition of thin films, electron beam lithography, or laser interference etching, as well as subsequent stripping and assembly processes. In addition, it is still difficult to manufacture high-resolution or ultra-high-resolution micro-nano channel structures by conventional methods.

For example, FIG. 1 is a cross-sectional structure schematic diagram of a micro-nano channel, as shown in FIG. 1, a foundation layer 12 is arranged on a base 11, and a plurality of foundation structures 13 are arranged on a side of the foundation layer 12 facing away from the base 11. Longitudinal cross-sections of each of the foundation structures 13 are rectangles, and heights of the plurality of the foundation structures 13 are equal to each other, a spacing between every two adjacent foundation structures 13 is equal, and the foundation structures 13 are formed by embossing with an embossing mold. Micro-nano channels 14 are formed directly above gaps 15 between two adjacent foundation structures 13. The micro-nano channels 14 are formed directly above each of the gaps 15 respectively, as shown in FIG. 1, a shape of a longitudinal cross-sectional of each of the micro-nano channels 14 is elliptical, and a spacing between adjacent micro-nano channels 14 is equal, the micro-nano channels 14 formed in this way are aligned in order, and the micro-nano channels 14 have same size and uniform shape.

FIG. 2A to FIG. 2E are manufacturing process diagrams of the micro-nano channel shown in FIG. 1.

Figure 2A:
FIG. 2A to FIG. 2E are manufacturing process diagrams of the micro-nano channel shown in FIG. 1.

As shown in FIG. 2A, a base 11 is provided.

For example, the base 11 is a rigid base or a flexible base. A material of the base 11 is glass, quartz, plastic, or other suitable materials.

Figure 2B:
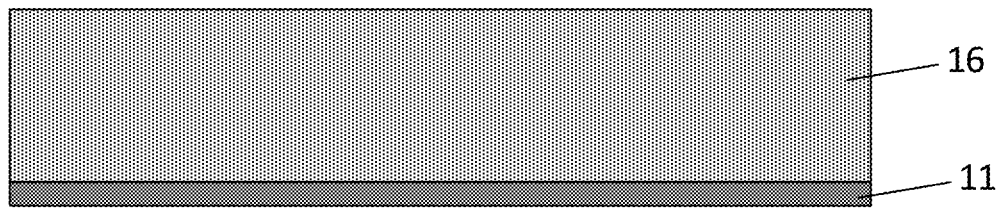

As shown in FIG. 2B, a foundation layer film 16 is applied (for example, coated) on the base 11.

For example, suitable materials for manufacturing the foundation layer include: insulating materials, semiconductor materials, conductive materials, or a combination of the materials mentioned above, which mainly depends on the application of a foundation layer; and the foundation layer is made to be conductive, semi-conductive, or insulating.

Figure 2C:
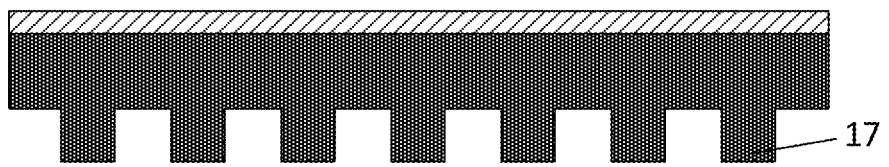
Figure 2C:
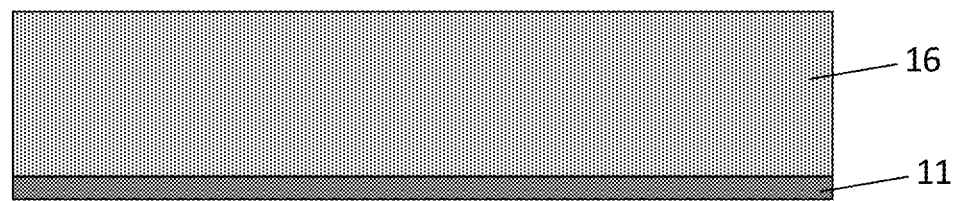

As shown in FIG. 2C, the foundation layer film 16 is embossed with an embossing plate 17 to form the foundation layer described in the following.

For example, in the process of embossing, a surface of the embossing plate 17 is subjected to uniform pressure at various positions.

Figure 2D:
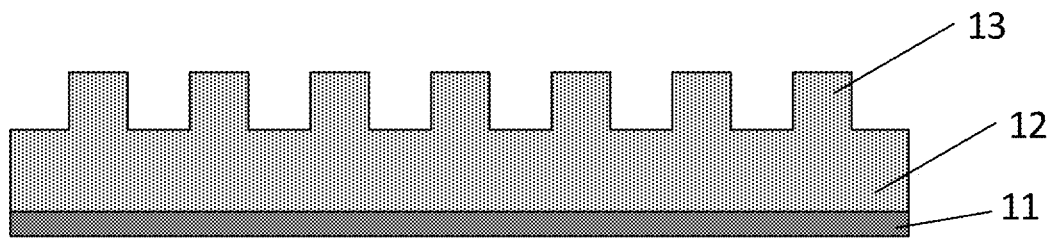

As shown in FIG. 2D, the formed foundation layer 12 includes a plurality of foundation structures 13, a zigzag structure formed by the plurality of the foundation structures 13 is complementary to the embossing plate 17; the embossing plate 17 has a fixed shape and a regular structure, thus the shape of the formed foundation structure 13 is also quite regular.

Figure 2E:
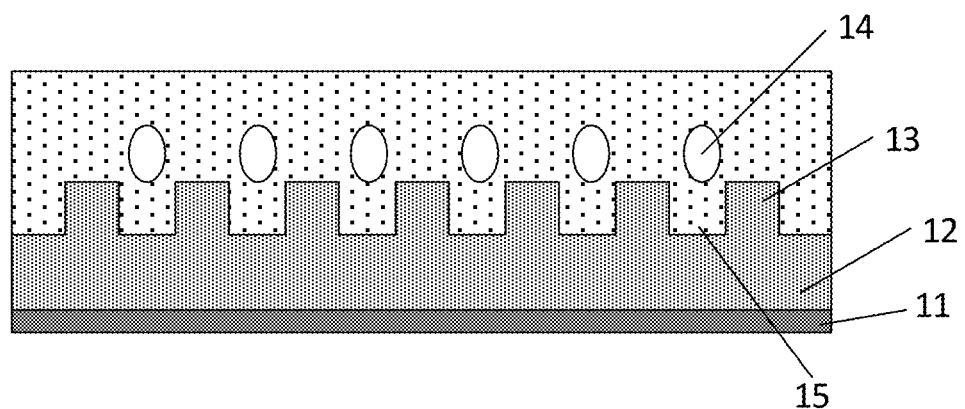

As shown in FIG. 2E, a thin film is deposited on the formed foundation structure 13 to form the micro-nano channel 14; due to the regular shape of the formed foundation structure 13, shape and size of the formed micro-nano channels 14 are also quite uniform.

The micro-nano channels formed by the above conventional method are same and uniform in their size and shape respectively. According to different application scenarios, the sizes of the formed micro-nano channels are required to change regularly, according to the conventional method, each change requires to select another embossing plate for embossing to form another set of patterns, and all the shapes of the formed foundation structures 13 are rectangular. Thus, the application scope of the micro-nano channel structure is greatly limited, and due to a high precision of the embossing plate, the price of the embossing plate is very expensive, so that the production cost is increased.

The inventors of the present disclosure found in research that a size, a shape, or an arrangement of the micro-nano channels to be formed vary according to different application scenarios by changing a shape, a size, and a spacing between adjacent foundation structures on the foundation layer.

For example, at least one embodiment of the present disclosure provides a micro-nano channel structure, and the micro-nano channel structure includes: a base substrate; a base layer, on the base substrate and including a plurality of protrusions; and a channel wall layer, on a side of the plurality of the protrusions away from the base substrate, and the channel wall layer is provided with a micro-nano channel; a recessed portion is provided between adjacent protrusions of the plurality of the protrusions, and an orthographic projection of the micro-nano channel on the base substrate is located within an orthographic projection of the recessed portion on the base substrate.

Figure 3:
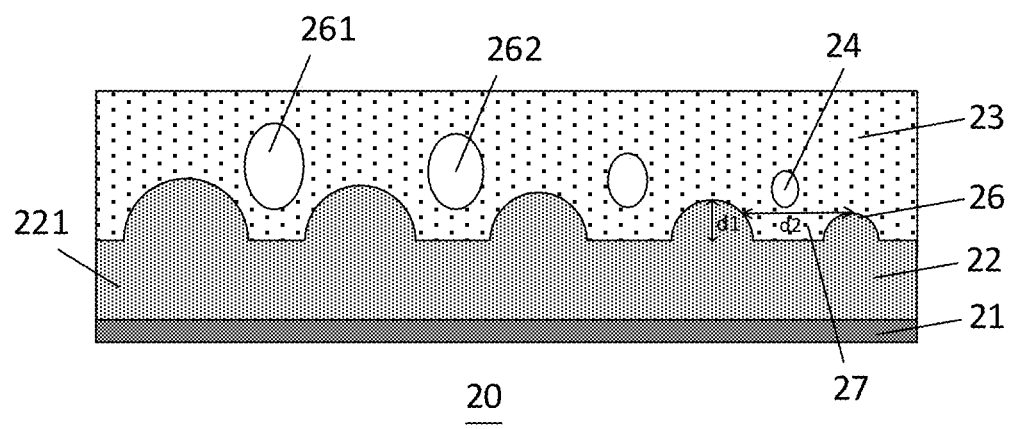
FIG. 3 is a cross-sectional structure schematic diagram of a micro-nano channel provided by an embodiment of the present disclosure.

For example, FIG. 3 is a cross-sectional structure schematic diagram of a micro-nano channel provided by an embodiment of the present disclosure. As shown in FIG. 3, the micro-nano channel structure 20 includes: a base substrate 21; a base layer 22, the base layer 22 is arranged on the base substrate 21 and includes a plurality of protrusions 26; and a channel wall layer 23, the channel wall layer 23 is arranged on a side of the plurality of the protrusions 26 away from the base substrate 21, and the channel wall layer 23 is provided with a micro-nano channel 24; a recessed portion 27 is provided between adjacent protrusions 26 of the plurality of the protrusions 26, and an orthographic projection of the micro-nano channel 24 on the base substrate 21 is located within an orthographic projection of the recessed portion 27 on the base substrate 21.

For example, a term "micro-nano channel" in embodiments of the present disclosure refers to a channel with at least one direction being in a range of about 1 nm to about 1000 μm (i.e., the section size in a cross-section of the channel); for example, in a range of about 1 nm to about 50 nm, in a range of about 50 nm to about 100 nm, in a range of about 100 nm to about 1 μm, in a range of about 1 μm to about 10 μm, in a range of about 10 μm to about 100 μm, in a range of about 100 μm to about 200 μm, in a range of about 200 μm to about 400 μm, in a range of about 400 μm to about 600 μm, in a range of about 600 μm to about 800 μm, or in a range of about 800 μm to about 1000 μm. A term "section size" may be a length, a width, a depth, and also relates to a diameter or an equivalent diameter. The terms "length", "width" and "depth" may also be an average length, an average width, and an average depth, respectively.

For example, each of the plurality of the protrusions 26 is in a shape of a strip, and the shape of the strip is a straight line, a curved line, a zigzag line, or a line having branches. An extending direction of the plurality of the protrusions is an extending direction of the strip.

For example, each of the recessed portions 27 is in shape of a strip, and the shape of the strip is a straight line, a curved line, a zigzag line, or a line having branches. An extending direction of each of the recessed portions 27 is an extending direction of the strip.

Correspondingly, the micro-nano channel 24 is also in a shape of a strip, and the shape of the strip is a straight line, a curved line, a zigzag line, or a line with branches. An extending direction of the micro-nano channel 24 is an extending direction of the strip.

For example, in a plane substantially perpendicular to the extending direction of the recessed portions 27, a cross-sectional shape of at least one of the plurality of the protrusions 26 is semicircular, triangular, trapezoidal, or irregular in shape.

For example, the cross-sectional shapes of the plurality of the protrusions 26 are the same, and is any one of the various shapes mentioned above; or the cross-sectional shapes of the plurality of the protrusions 26 are different from each other, and are any combinations of the various shapes mentioned above. For example, FIG. 3 shows a case that all the cross-sectional shapes of the plurality of the protrusions 26 are semicircular in shape.

For example, as shown in FIG. 3, the base layer 22 further includes a base portion 221 connected with the plurality of the protrusions 26, and the cross-sectional shape of the base layer 22 in the plane substantially perpendicular to the extending direction of the recessed portions 27 is a U-shape with a large opening.

For example, the extending direction of the recessed portion 27 is a direction perpendicular to a plane of the paper and inwards.

For example, a thickness of the base portion 221 is ⅒ to ½ of an average thickness of the protrusions 26. A thinner thickness of the base portion 221 is beneficial to the thinning of the formed micro-nano channel structure.

For example, the thickness of the base portion 221 is ⅒, ⅛, ⅙, ¼, or ½ of the average thickness of the protrusions 26.

For example, the plurality of the micro-nano channels 24 can be formed with different sizes by controlling the deformation of the base layer 22, to achieve the screening of the samples to be tested. For example, in a case that a solution containing proteins or charged particles of different sizes flows through the micro-nano channel having cross-sections with gradually decreasing sizes, a filtration separation of substances is achieved.

Figure 4:
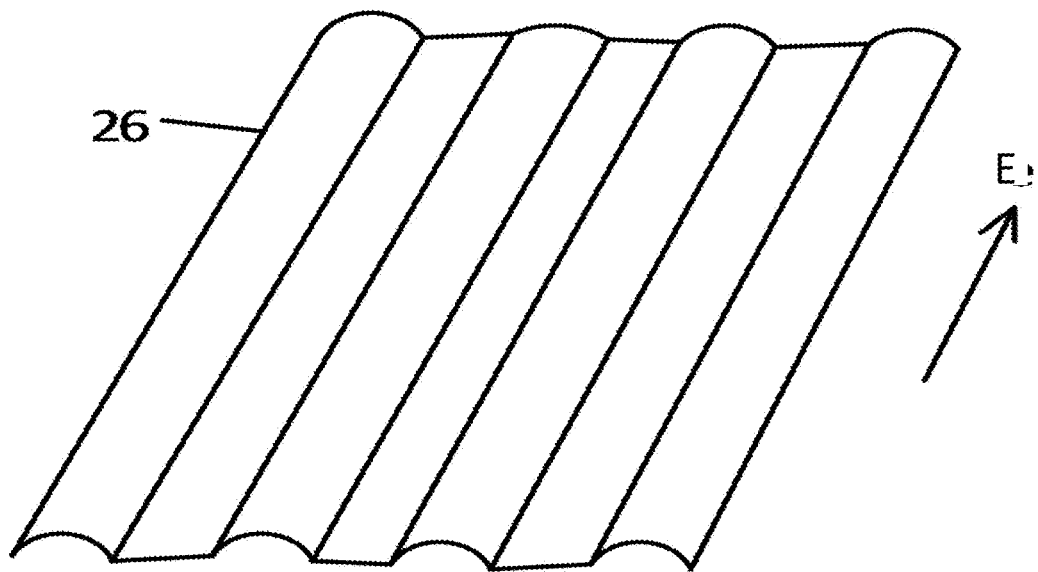
FIG. 4 is a top view structure schematic diagram of a base layer provided by an embodiment of the present disclosure.

FIG. 4 is a top view structure schematic diagram of a base layer provided by an embodiment of the present disclosure. With reference to FIG. 3 and FIG. 4, in a case that all the cross-sectional shapes of the plurality of the protrusions 26 are semicircular, a surface formed by the plurality of the protrusions 26 is in a shape of a wave. The structure in a shape of a wave makes that the shapes of the micro-nano channels formed subsequently more controllable.

For example, adjacent sides of adjacent protrusions 26 of the plurality of the protrusions 26 in the plane substantially perpendicular to the extending direction of the recessed portion 27 are connected with each other or spaced apart from each other. In a case that adjacent sides of the adjacent protrusions 26 are connected with each other, a side of the recessed portion 27 close to the base substrate 21 is a line, and the extending direction of the line is the extending direction of the recessed portion 27. In a case that the adjacent sides of the adjacent protrusions 26 are spaced apart from each other, the side of the recessed portion 27 close to the base substrate 21 is a surface, a long side direction of the surface is the extending direction of the recessed portion 27.

For example, the extending direction of the recessed portion 27 is a direction E shown in FIG. 4.

For example, as shown in FIG. 3 and FIG. 4, a gap is provided between two adjacent protrusions 26, in the top view diagram shown in FIG. 4, the surface of the recessed portion 27 close to the base substrate 21 is a surface.

It should be noted that, in a case that all the cross-sectional shapes of the plurality of the protrusions 26 are semicircular, adjacent protrusions 26 among the plurality of the protrusions 26 are connected with each other, thus the surface of the recessed portion 27 close to the base substrate 21 is a line.

Figure 5:
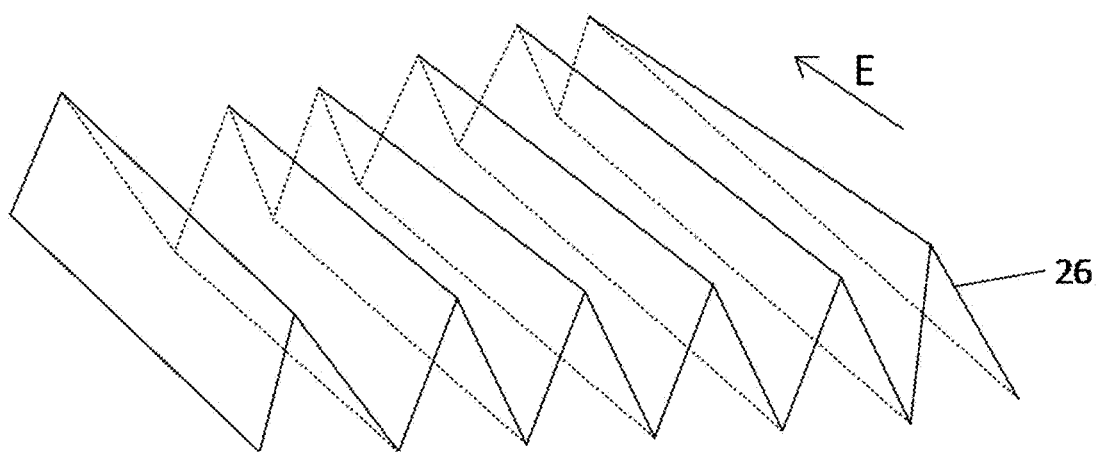
FIG. 5 is a top view structure schematic diagram of a base layer provided by another embodiment of the present disclosure.
Figure 5A:
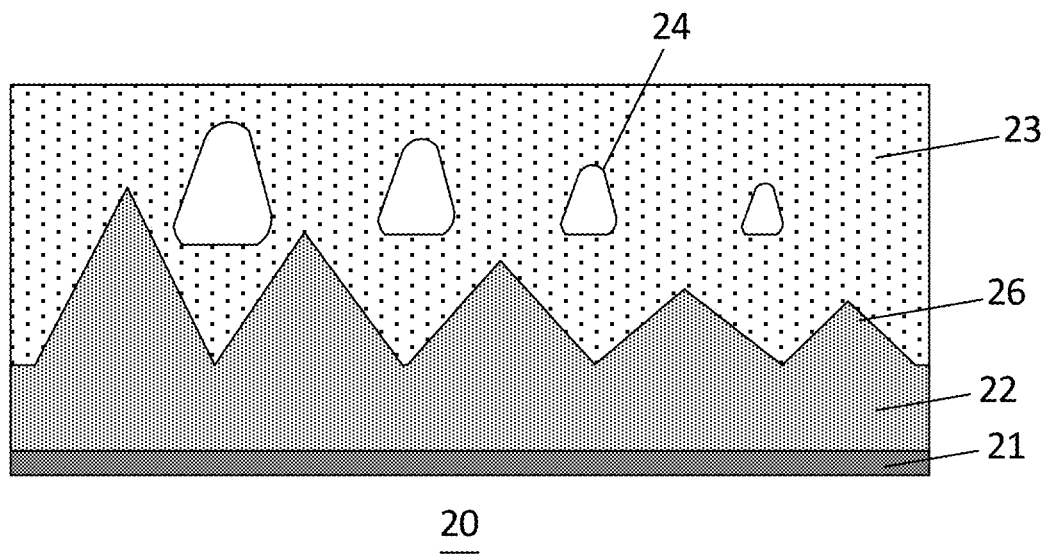
FIG. 5A is a cross-sectional structure schematic diagram of the base layer shown in FIG. 5.

For example, FIG. 5 is a top view structure schematic diagram of a base layer provided by another embodiment of the present disclosure, and FIG. 5A is a cross-sectional structure schematic diagram of the base layer shown in FIG. 5. As shown in FIG. 5A, all the cross-sectional shapes of the plurality of the protrusions 26 are triangles (may also be replaced by trapezoids); as shown in FIG. 5, the surface formed by the plurality of the protrusions 26 is sawtooth-shaped. The sawtooth-shaped structure makes that the shapes of the micro-nano channels formed subsequently more controllable.

For example, as shown in FIG. 5 and FIG. 5A, two adjacent protrusions 26 are directly connected with each other, in the top view diagram shown in FIG. 4, the surface of the recessed portion 27 close to the base substrate 21 is a line.

For example, the extending direction of the recessed portion 27 is a direction E shown in FIG. 5.

It should be noted that, in a case that all the cross-sectional shapes of the plurality of the protrusions 26 are semicircular, the adjacent protrusions 26 of the plurality of the protrusions 26 are connected with each other, thus the surface of the recessed portion 27 close to the base substrate 21 is a line.

For example, under the condition of the base layer 22 with different shapes and combined with the deposition conditions of the subsequent channel wall layer, the micro-nano channel 24 may have any selectable cross-sectional shapes, for example, U-shaped, rectangular, triangular, triangular-like, elliptical, elliptical-like, circular, semi-circular, square, trapezoidal, pentagonal, hexagonal, water drop-shaped and other cross-sectional shapes. For example, the micro-nano channel 24 has an irregular cross-sectional shape. The following embodiments are described by taking the cross-sectional shape of the micro-nano channel 24 as an ellipse, a triangle-like, a circle, or a water drop as an example.

For example, in a continuous micro-nano channel 24, the shapes of the cross-sections of the continuous micro-nano channel 24 are the same everywhere, and the sizes of the cross-sections of the micro-nano channel 24 are the same everywhere, or the shapes and the sizes of the cross-sections of the continuous micro-nano channel 24 can change along the extending direction of the micro-nano channel 24.

Figure 6A:
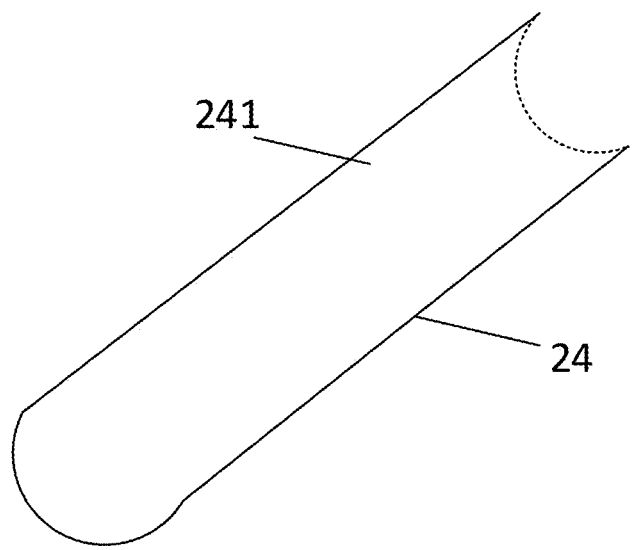
FIG. 6A is a three-dimensional structure schematic diagram of a micro-nano channel provided by an embodiment of the present disclosure.

For example, FIG. 6A is a three-dimensional structure schematic diagram of a micro-nano channel provided by an embodiment of the present disclosure. As shown in FIG. 6A, the micro-nano channel 24 is a semi-closed micro-nano channel, and the semi-closed micro-nano channel 24 is provided with an open portion 241. The open portion 241 is on a side of the micro-nano channel 24 away from the base substrate, that is, at the moment when a subsequently deposited material of the channel wall layer may cause the micro-nano channel 24 to form a closed structure, the deposition of the material will be stopped, so that a fluid (liquid, gas, or a combination of liquid and gas) can enter the micro-nano channel from the open portion 241.

For example, on a side of the micro-nano channel 24 away from the base substrate 21, the semi-closed micro-nano channel 24 is completely open to form a micro-nano groove, or the semi-closed micro-nano channel 24 is partially open.

Figure 6B:
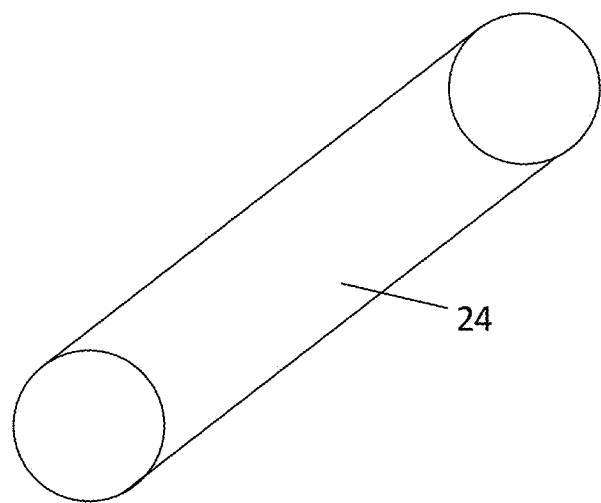
FIG. 6B is a three-dimensional structure schematic diagram of a micro-nano channel provided by another embodiment of the present disclosure.

For example, FIG. 6B is a three-dimensional structure schematic diagram of a micro-nano channel provided by another embodiment of the present disclosure. As shown in FIG. 6B, the micro-nano channel 24 is a closed micro-nano channel, that is, the deposition of the material is stopped until the deposited material of the channel wall layer causes the micro-nano channel 24 to form a closed structure. The fluid enters the micro-nano channel 24 from two ends of the micro-nano channel 24 along the extension direction of the micro-nano channel 24, and the micro-nano channel 24 is a micro-nano capillary.

For example, as shown in FIG. 6A, the cross-sectional shape of the micro-nano channel 24 in the plane substantially perpendicular to the extending direction of the micro-nano channel 24 is a ⅔ circle; and as shown in FIG. 6B, the cross-sectional shape of the micro-nano channel 24 in the plane substantially perpendicular to the extending direction of the micro-nano channel 24 is circular. In the examples shown in FIG. 6A and FIG. 6B, radius of the micro-nano channel 24 is less than 100 nm, for example, the radius of the cross-section of the micro-nano channel 24 is from 40 nm to 80 nm.

For example, a ratio of a maximum depth to a maximum width of the recessed portion 27 in the plane substantially perpendicular to the extending direction of the recessed portion 27 is 1 to 5.

For example, the ratio of the maximum depth to the maximum width of the recessed portion 27 is 1, 2, 3, 4, or 5.

For example, in a case that the ratio of the maximum depth to the maximum width of the recessed portion 27 is less than 1, it is not conducive to form the micro-nano channel 24, or it may not be able to form the micro-nano channel 24, or it takes a long time for the subsequent deposition of the channel wall layer 23 to form the micro-nano channel 24, in this way, the production cycle is prolonged and the production cost is increased; in a case that the ratio of the maximum depth to the maximum width of the recessed portion 27 is greater than 5, the size of the formed micro-nano channel 24 is too small, and the application range of the micro-nano channel structure 20 is limited.

For example, in the micro-nano channel structure provided by at least one embodiment of the present disclosure, both the number of the recessed portion 27 and the number of the micro-nano channels 24 are multiple; in the plane substantially perpendicular to the extending direction of the recessed portions 27, the maximum widths of the adjacent recessed portions 27 are different from each other, and the heights of the adjacent protrusions 26 of the plurality of the protrusions 26 are also different from each other, so that the sizes of the cross-sectional areas of adjacent micro-nano channels 24 are different from each other; or the maximum widths of the adjacent recessed portions 27 are different from each other, so that the sizes of the cross-sectional areas of the adjacent micro-nano channels 24 are different from each other; alternatively, the heights of adjacent protrusions 26 of the plurality of protrusions 26 are different from each other, so that the sizes of the cross-sectional areas of the adjacent micro-nano channels 24 are different from each other. That is, in the plane substantially perpendicular to the extending direction of the recessed portion 27, the cross-sectional area of the micro-nano channel 24 is proportional to the maximum width of the recessed portion 27 directly facing the micro-nano channel 24, and the cross-sectional area of the micro-nano channel 24 is proportional to the height of the protrusion 26 adjacent to the micro-nano channel 24.

For example, as shown in FIG. 3, in the plane substantially perpendicular to the extending direction of the recessed portion 27, the maximum widths of the recessed portions 27 and the heights of the adjacent protrusions 26 of the plurality of protrusions 26 are gradually decreased in a same direction, so that the sizes of the cross-sectional areas of the micro-nano channels 24 are gradually decreased. As shown in FIG. 3, the height of each of the protrusions 26 refers to a distance from a top end of a semicircular protrusion 26 to an upper surface of the base layer 22, that is, a distance d1 as shown in FIG. 3; the maximum width between the adjacent recessed portions 27 refers to a horizontal distance from the top end of the semicircular protrusion 26 with a lower height to the side surface of the protrusion adjacent to the semicircular protrusion 26, that is, a distance d2 as shown in FIG. 3.

Figure 7:
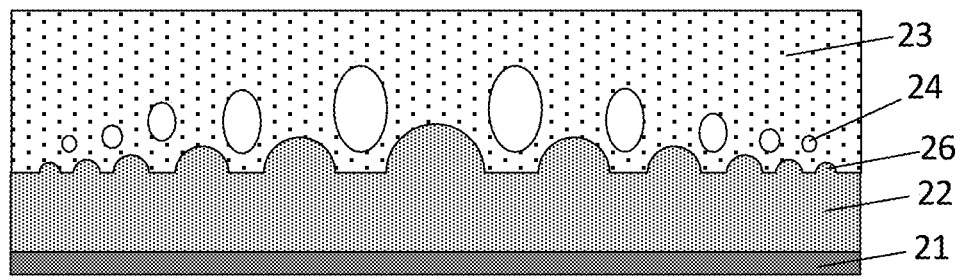
FIG. 7 is a cross-sectional structure schematic diagram of a micro-nano channel provided by still another embodiment of the present disclosure.

For example, FIG. 7 is a cross-sectional structure diagram of a micro-nano channel provided by another embodiment of the present disclosure. As shown in FIG. 7, in the plane substantially perpendicular to the extending direction of the recessed portion 27, in the same direction, the maximum widths between the adjacent recessed portions 27 are increased firstly and then decreased, and the heights of adjacent protrusions 26 of the plurality of the protrusions 26 are increased firstly and then decreased, so that the cross-sectional area of the adjacent micro-nano channels 24 are increased firstly and then decreased under the deposition conditions of the subsequent channel wall layer.

Figure 8:
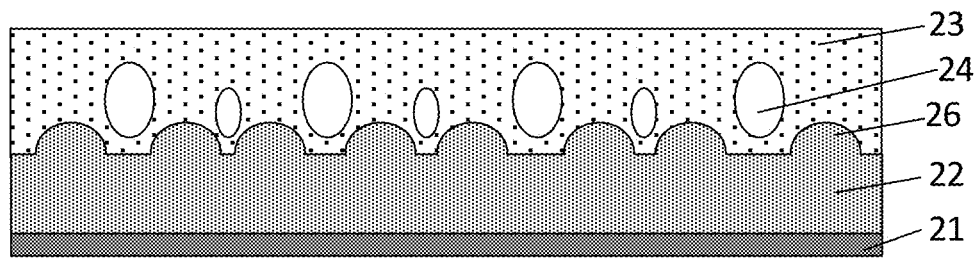
FIG. 8 is a cross-sectional structure schematic diagram of a micro-nano channel provided by yet another embodiment of the present disclosure.

For example, FIG. 8 is a cross-sectional structure diagram of a micro-nano channel provided by another embodiment of the present disclosure. As shown in FIG. 8, in the plane substantially perpendicular to the extending direction of the recessed portion 27, in the same direction, the heights of the adjacent protrusions are the same, and in the same direction, the maximum widths between the adjacent recessed portions 27 are arranged to be one larger and one smaller, and the plurality of the recessed portions 27 are arranged alternately to be one larger and one smaller, accordingly, in the same direction, the cross-sectional areas of the adjacent micro-nano channels 24 are arranged to be one larger and one smaller, so that the plurality of the micro-nano channels 24 are also arranged alternately to be one larger and one smaller under the deposition conditions of the subsequent channel wall layer.

For example, as shown in FIG. 3, FIG. 7 and FIG. 8, the orthographic projection of each of the plurality of the micro-nano channels 24 on the base substrate 21 is located within the orthographic projection of one of the plurality of the recessed portions 27 directly facing the micro-nano channel 24 on the base substrate 21. A micro-nano channel 24 is correspondingly disposed above each of the recessed portions 27, and the micro-nano channels 24 are completely formed directly above the recessed portions 27. Directly above means that in the direction perpendicular to a plate surface of the base substrate 21, the micro-nano channel 24 is disposed above the corresponding recessed portion 27.

For example, as shown in FIG. 3, FIG. 7 and FIG. 8, the micro-nano channels 24 with different cross-sectional sizes in the micro-nano channel structure 20 can separate fluid molecules with different sizes, which also facilitates subsequent processes such as testing.

For example, in the plane substantially perpendicular to the extending direction of the recessed portion 27, the maximum widths of the micro-nano channels 24 are 3 μm to 50 μm. That is, the maximum widths of the micro-nano channels 24 are from 3 nanometers to 300 nanometers, from 300 nanometers to 500 nanometers, from 500 nanometers to 1 micrometer, or from 1 micrometer to 50 micrometers. If a cross-section of the micro-nano channel 24 is a circle in shape, the maximum width is a diameter of the circle; if the cross-section of the micro-nano channel 24 is an ellipse in shape, the maximum width is a long diameter of the ellipse; if the cross-section of the micro-nano channel 24 is a rectangle in shape, the maximum width is a length of a long side of the rectangle; and if the cross-section of the micro-nano channel 24 is a square in shape, the maximum width is a side length of the square.

For example, materials of the base layer 22 include various suitable materials, for example, the materials suitable for making the base layer 22 include: an insulating material, a semiconductor material, a conductive material, or a combination of the materials mentioned above. According to different application scenarios, the base layer 22 is made to be conductive, semi-conductive, or insulating.

For example, the material of the base layer 22 is a conductive material, in this way, the base layer 22 is further used as an electrode of a device. In a case that the micro-nano channel structure 20 is used in subsequent devices, the step of manufacturing the electrode is reduced.

For example, the material of the channel wall layer 23 includes: an insulating material, a semiconductor material, a conductive material, or a combination of the materials mentioned above. According to different application scenarios, the channel wall layer 23 is made to be conductive, semi-conductive, or insulating.

For example, the material of the channel wall layer 23 is the same as or different from the material of the base layer 22.

For example, the material for forming both the channel wall layer 23 and the base layer 22 includes an organic material, for example: organosilicon polymer, polyimide, polycarbonate, polyamide, polyether, polyurethane, polyfluorocarbon, fluorinated polymer, poly-ether-ether-ketone (PEEK), polystyrene, poly (acrylonitrile-butadiene-styrene) (ABS), acrylate, polymethyl methacrylate, and other substituted and unsubstituted polyolefins.

For example, the organosilicon polymer includes: polydimethylsiloxane and epoxy polymers.

For example, the polyimide includes: poly (4,4'-oxydiphenylene-pyromellitimide) and poly (biphenyltetracarboxylic dianhydride).

For example, the fluorinated polymer includes: polyvinyl fluoride, polyvinylidene fluoride, polytetrafluoroethylene, polychlorotrifluoroethylene, perfluoroalkoxy polymer, fluoroethylene-propylene, polyethylene tetrafluoroethylene, polyethylene trifluorochloroethylene, perfluoropolyether, perfluorosulfonic acid, perfluoropoloxyheterocyclobutane, FFPM/FFKM (perfluorinated elastomer [perfluoroelastomer]), FPM/FKM (fluorocarbon [trifluorochloroethylene vinylidene fluoride]).

For example, the substituted and unsubstituted polyolefins include: cycloolefin polymer, polypropylene, polybutene, polyethylene, polymethylpentene, polybutene-1, polyisobutylene, and ethylene propylene rubber.

For example, polyethylene (PE) includes: crosslinked PE, high density PE, medium density PE, linear low-density PE, or ultra-high molecular weight PE.

For example, the material for forming both the channel wall layer 23 and the base layer 22 includes an inorganic material, for example, the inorganic material includes: ceramic, semiconductor, glass, and metal and so on.

For example, the ceramic includes: alumina, silica, and zirconia, and so on.

For example, the semiconductor includes: silicon and gallium arsenide.

For example, in the schematic diagrams of the micro-nano channel structure shown in FIG. 3, FIG. 7, and FIG. 8, the channel wall layers are connected into a whole.

Figure 9:
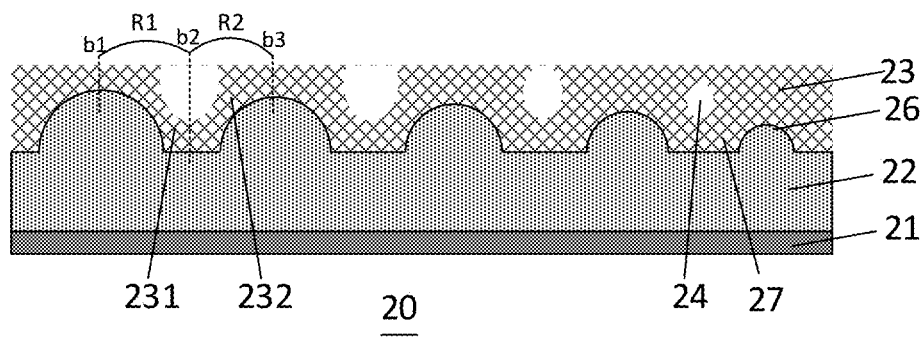
FIG. 9 is a cross-sectional structure schematic diagram of a micro-nano channel provided by yet another embodiment of the present disclosure.

FIG. 9 is a cross-sectional structure schematic diagram of a micro-nano channel provided by still another embodiment of the present disclosure. As shown in FIG. 9, a portion of the micro-nano channels 24 are closed micro-nano channels, the cross-sectional shapes of the closed micro-nano channels 24 are the same or different from each other, and the cross-sectional areas of the closed micro-nano channels 24 are different from each other; a portion of the micro-nano channels 24 are semi-closed micro-nano channels, and the cross-sectional areas of the semi-closed micro-nano channels are not the same, which can be adapted to the requirements of more applications.

For example, in the process of manufacturing the micro-nano channel structure, in a case that the deposited channel wall layer material meets the requirement that at least a portion of the micro-nano channels are closed micro-nano channels, the deposition of the channel wall layer material is stopped. As shown in FIG. 9, the channel wall layer 23 includes a first channel wall 231 and a second channel wall 232 that are at least partially spaced apart from each other, so that the micro-nano channel 24 is formed at a portion where the first channel wall 231 and the second channel wall 232 are spaced apart from each other.

For example, as shown in FIG. 9, two sides of each micro-nano channel 24 are provided with the first channel wall 231 and the second channel wall 232 respectively, a line b1 perpendicular to the base substrate 21 from the top of the protrusion 26 immediately adjacent to the left side of the micro-nano channel 24 is drawn, a line b2 perpendicular to the base substrate 21 from the bottom of the micro-nano channel 24 is drawn, a line b3 perpendicular to the base substrate 21 from the top of the protrusion 26 immediately adjacent to the right side of the micro-nano channel 24 is drawn, so that the channel wall in a region R1 between the line b1 and the line b2 is the first channel wall 231, and the channel wall in a region R2 between the line b2 and the line b3 is the second channel wall 232.

For example, as shown in FIG. 9, the first channel wall 231 protrudes along a side of the protrusion 26 away from the base substrate 21, and an orthographic projection of the first channel wall 231 on the base substrate 21 covers an orthographic projection of the protrusion 26 directly facing towards the first channel wall 231 on the base substrate 21; the second channel wall 232 protrudes along a side of the protrusion 26 away from the base substrate 21, and an orthographic projection of the second channel wall 232 on the base substrate 21 covers an orthographic projection of the protrusion 26 directly facing towards the second channel wall 232 on the base substrate 21. For example, both the first channel wall 231 and the second channel wall 232 extend along an extending direction parallel to the recessed portion 27.

For example, as shown in FIG. 9, the first channel wall 231 and the second channel wall 232 are at least partially separated from each other on a side of the micro-nano channel 24 away from the base substrate 21, and the micro-nano channel 24 is at least partially open on a side away from the base substrate 21. In an example, in an entire length of the micro-nano channel 24 along the extending direction parallel to a plane of a main surface of the base substrate 21, the first channel wall 231 and the second channel wall 232 are completely separated from each other on the side of the micro-nano channel 24 away from the base substrate 21 to form the micro-nano channel shown in FIG. 6A. For example, the micro-nano channel 24 is a micro-nano groove.

For example, as shown in FIG. 9, the first channel wall 231 and the second channel wall 232 are connected with each other on the side of the micro-nano channel 24 away from the base substrate 21. In an example, the micro-nano channel 24 is closed on a side of the micro-nano channel 24 away from the base substrate 21. In an entire length of the micro-nano channel 24 along the extending direction substantially parallel to the plane of the main surface of the base substrate 21, the first channel wall 231 and the second channel wall 232 are connected with each other on the side of the micro-nano channel 24 away from the base substrate 21 to form the micro-nano channel shown in FIG. 6B. For example, the micro-nano channel 24 is a micro-nano capillary.

Figure 10:
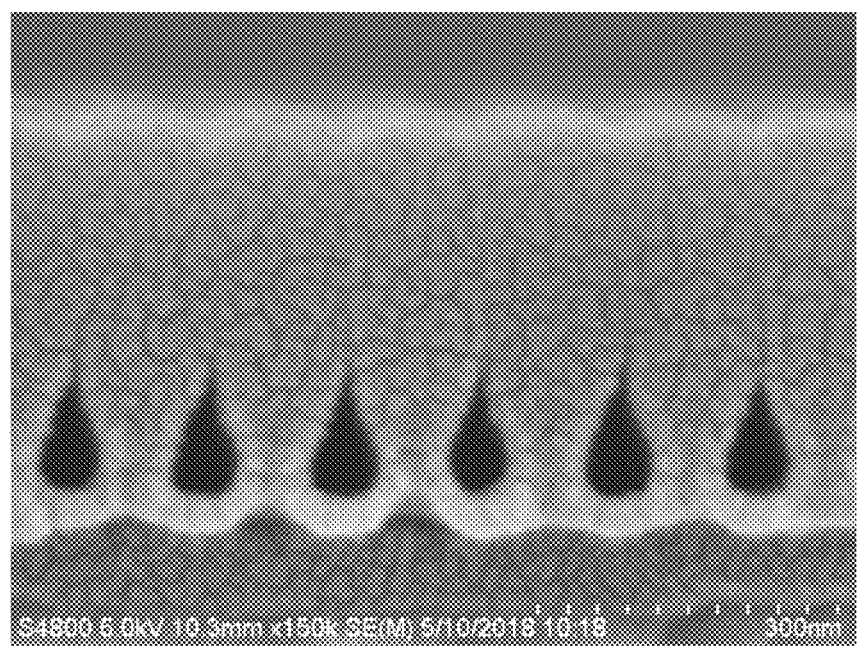
FIG. 10 is a scanning electron microscope image of a micro-nano channel provided by an embodiment of the present disclosure.

For example, FIG. 10 is a scanning electron microscope image of a micro-nano channel provided by an embodiment of the present disclosure. The micro-nano channel structure shown in FIG. 10 corresponds to the micro-nano channel structure shown in FIG. 3, and the micro-nano channel 24 is closed on a side away from the base substrate 21, for example, the micro-nano channel 24 is a micro-nano capillary shown in FIG. 6B. It can be seen from FIG. 10, the maximum width of the micro-nano channel is 30 nm.

For example, in an application scenario, the micro-nano channel can filter and separate material with different sizes or different charged properties, the material that can be separated is determined by the size of a narrowest part of the micro-nano channel, that is, a deformation degree of the base layer determines a size of the formed micro-nano channels, thus a type of the material that can be filtered and separated is determined.

For example, in another application scenario, nano-particles with biological modification on the surfaces are added to the narrowest part of the micro-nano channel, in a case that a biomolecule to be tested combines with antibody on the surface of the nanoparticles, an electric resistance of the micro-nano channel provided with the nano-particles is changed, and different biomolecules get different electrical signals, so as to identify different biomolecules, thus the function of the biological detection is achieved.

For example, in another application scenario, the micro-nano channel can be used for a high-precision molecular detection including gene sequencing or a reagent detection. At present, a direction of a nanopore structure is perpendicular to the base substrate, a film layer with a flow path needs to be formed on both the top and the bottom of the nanopore, so the nanopore structure is complex and the yield is low; the micro-nano channels in the embodiments of the present disclosure are parallel to the plate surface of the base substrate, the structure is simple, electrodes are easy to integrate on both sides of the micro-nano channel, and potential changes caused by DNA molecules passing through the micro-nano channel can be tested, so that the gene sequencing is achieved.

Figure 11:
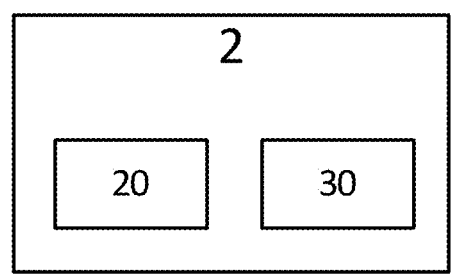
FIG. 11 is a block diagram of a sensor provided by an embodiment of the present disclosure.

At least one embodiment of the present disclosure further provides a sensor, for example, FIG. 11 is a block diagram of a sensor provided by an embodiment of the present disclosure, and the sensor 2 includes any one of the micro-nano channel structures 20 in the above embodiments and a sensing circuit 30.

For example, the base substrate included in the sensor is a base substrate on which the micro-nano channel structure 20 and the sensing circuit 30 are to be formed simultaneously. For example, the base layer included in the micro-nano channel structure 20 is made of a conductive material. The plurality of the protrusions in the base layer are the electrodes of the sensor, and the plurality of the protrusions (electrodes of the sensor) are connected with the sensing circuit on the base substrate. The electrodes of the sensor are configured to detect at least one of a chemical signal and a biological signal in the micro-nano channel.

For example, the types of the sensor 2 including the micro-nano channel structure 20 are as follows, for example, a gas sensor, a desoxyribonucleicacid (DNA) sensor, a ribonucleicacid (RNA) sensor, a peptide or protein sensor, an antibody sensors, an antigen sensor, a tissue factor sensor, a vector and viral vector sensor, a lipid and fatty acid sensor, a steroid sensor, a neurotransmitter sensor, an inorganic ion and electrochemical sensor, a pH sensor, a free radical sensor, a carbohydrate sensor, a neural sensor, a chemical sensor, a small molecule sensor, an exon sensor, a metabolite sensor, an intermediate sensor, a chromosome sensor and a cell sensor.

For example, the micro-nano channel structure is a part of a gas sensor for detecting gas. Due to the existence of the micro-nano channel structure, the gas sensor is provided with a large surface area for absorbing target gas molecules, so that the sensor is very sensitive.

For example, the micro-nano channel is open on the side away from the base substrate, gas flows into the micro-nano channel from an open side of the micro-nano channel, thus target gas molecules are adsorbed on an inner surface of the micro-nano channel. In an example, the plurality of the protrusions made from the conductive material are sensing electrodes for detecting target gas molecules adsorbed on the inner surface of the micro-nano channel.

At least one embodiment of the present disclosure further provides a microfluidic device, and the microfluidic device includes any one of the micro-nano channel structures mentioned above.

For example, the microfluidic device refers to a small device which can separate molecules based on a small volume and/or a small flow rate.

For example, the microfluidic device is a chip laboratory device, a genetic sequencing device and so on.

For example, the chip laboratory refers to an integrated chip on which various scientific operations (such as reaction, separation, purification, and detection) of a sample solution can be performed simultaneously, the chip laboratory can be used to perform ultra-high-sensitivity analysis, ultra-micro-analysis, or ultra-flexible simultaneous multi-project analysis, an example of the chip laboratory is a chip provided with a protein production unit, a protein purification unit, and a protein detection unit that are connected with each other by a micro-nano channel.

For example, in a case that the base layer in the micro-nano channel structure is made from a conductive material, and two adjacent protrusions included in the base layer are used as test electrodes in the microfluidic device, the test electrodes are configured to effectively detect various physical and chemical parameters in the micro-nano channel, the parameters that can be measured by the test electrodes include: a resistance in a region located between the two adjacent protrusions, a voltage level in the region located between the two adjacent protrusions, a capacitance in the region located between the two adjacent protrusions and so on. By measuring the parameters, the microfluidic device can efficiently detect biological molecules and chemical molecules in the micro-nano channel, and the microfluidic device can be used in various related applications.

For example, the base layer made from the conductive material is configured as a control electrode that controls the transport of material in the micro-nano channel structure. The control electrode controls the transport of the material (for example, a nucleic acid molecule including DNA) through the micro-nano channel, and both the intensity of the electric field and the uniformity of the electric field distributed around the micro-nano channel are greatly improved. Compared with conventional microfluidic devices, the performance of the microfluidic device is greatly improved. The microfluidic device can be used in an ion valve, a molecular valve, an electrically controlled microfluidic device, a light-controlled microfluidic device and an ion transistor.

Figure 12:
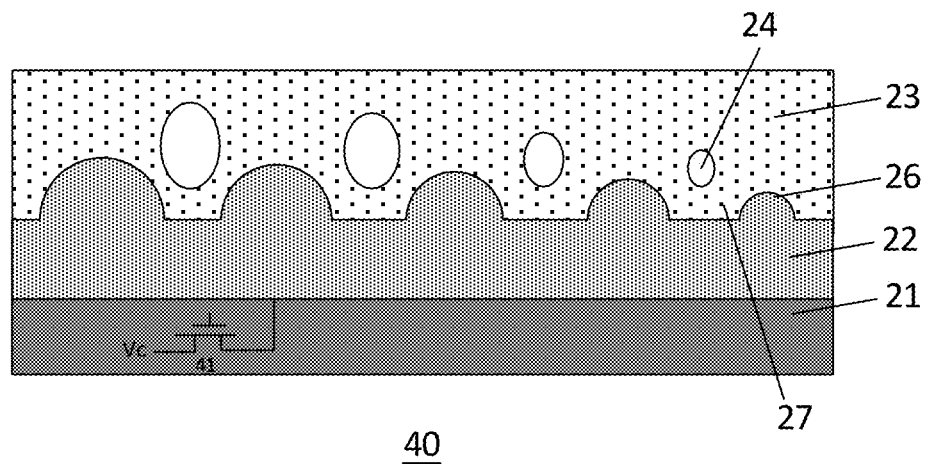
FIG. 12 is a schematic structural diagram of a microfluidic device provided by an embodiment of the present disclosure.

For example, FIG. 12 is a schematic structural diagram of a microfluidic device provided by an embodiment of the present disclosure. As shown in FIG. 12, the microfluidic device 40 is an electrically controlled microfluidic device. The micro-nano channel structure in FIG. 3 is used in the microfluidic device shown in FIG. 12, and the microfluidic device 40 is provided with a transistor 41 electrically connected with the base layer 22 of the micro-nano channel structure. The transistor 41 is configured to be applied with a control voltage. In a case that the transistor 41 is electrically conducted, the control voltage is transferred to the base layer 22. For example, the micro-nano channel structure is a micro-nano channel structure used to control the transport of the substance through the micro-nano channel, and the base layer 22 is a control electrode of the microfluidic device 40. By transmitting the control signal to the base layer 22, the transport of the substance in the micro-nano channel can be electrically controlled.

For example, the transistor 41 is arranged in the base substrate 21, or arranged outside the micro-nano channel.

Figure 13:
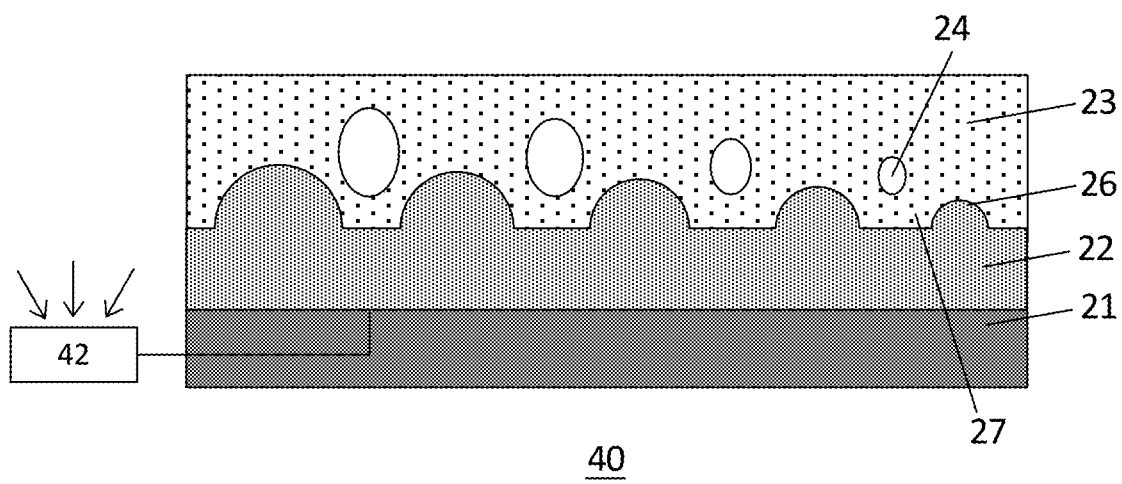
FIG. 13 is a schematic structural diagram of a microfluidic device provided by another embodiment of the present disclosure.

For example, FIG. 13 is a schematic structural diagram of a microfluidic device provided by still another embodiment of the present disclosure, as shown in FIG. 13, the microfluidic device 40 is a light-controlled microfluidic device. The micro-nano channel structure in FIG. 3 is used in the micro-fluidic device shown in FIG. 12, and the microfluidic device 40 is provided with a photo sensor 42 that is electrically connected with the base layer 22 of the micro-nano channel structure. In a case that the photo sensor 42 is irradiated, the photo sensor 42 generates a photo voltage signal, and the photo voltage signal is transmitted to the base layer 22. For example, the micro-nano channel structure is a micro-nano channel structure used for controlling the transport of the material passing through the micro-nano channel, and the base layer 22 is a control electrode of the microfluidic device. By transmitting the photo voltage signal to the base layer 22, it is possible to optically control the transport of the material in the micro-nano channel.

For example, the microfluidic device is an ion transistor, for example, a switching transistor or a driving transistor, the base layer in the micro-nano channel structure is used as a gate electrode of the ion transistor, which is configured to be provided with a gate driving signal.

Figure 14:
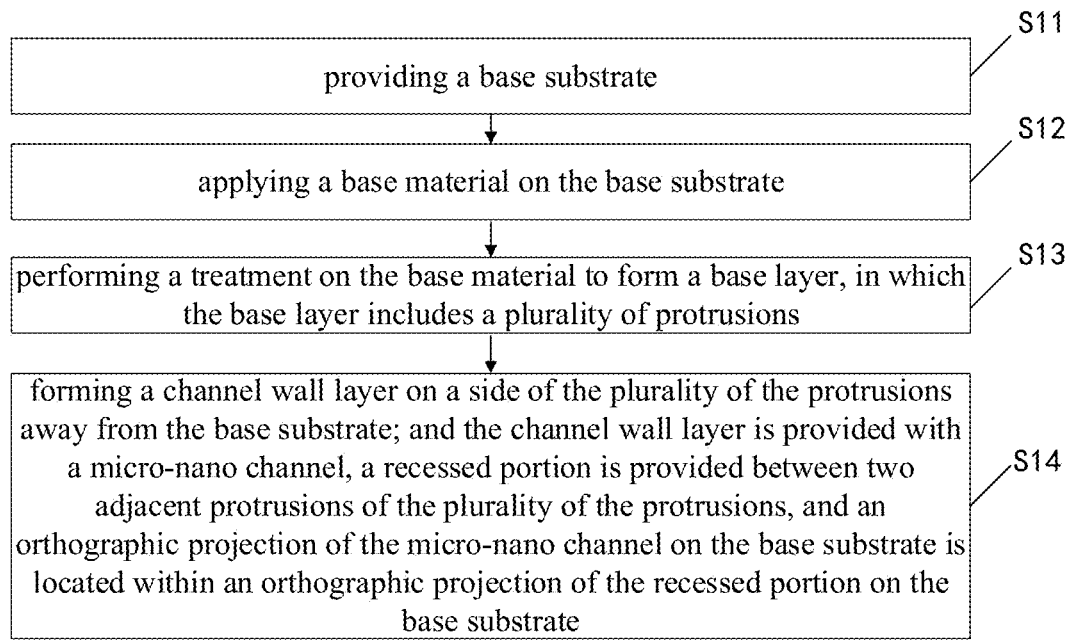
FIG. 14 is a flowchart of a method for manufacturing a micro-nano channel structure provided by an embodiment of the present disclosure.

At least one embodiment of the present disclosure furhter provides a method for manufacturing a micro-nano channel structure, for example, FIG. 14 is a flowchart of a method for manufacturing a micro-nano channel structure provided by an embodiment of the present disclosure, as shown in FIG. 14, the manufacturing method includes:

S11: providing a base substrate;

S12: applying a base material on the base substrate;

S13: performing a treatment on the base material to form a base layer, in which the base layer includes a plurality of protrusions;

S14: forming a channel wall layer on a side of the plurality of protrusions away from the base substrate; and the channel wall layer is provided with a micro-nano channel, a recessed portion is provided between two adjacent protrusions of the plurality of protrusions, and an orthographic projection of the micro-nano channel on the base substrate is located within an orthographic projection of the recessed portion on the base substrate.

For example, FIG. 15A to FIG. 15E are process diagrams for manufacturing a micro-nano channel structure provided by an embodiment of the present disclosure. The manufacturing process of the micro-nano channel structure is described in detail below according to FIG. 15A to FIG. 15E.

Figure 15A:
FIG. 15A to FIG. 15E are process diagrams for manufacturing a micro-nano channel structure provided by an embodiment of the present disclosure.

As shown in FIG. 15A, a base substrate 21 is provided.

Figure 15B:
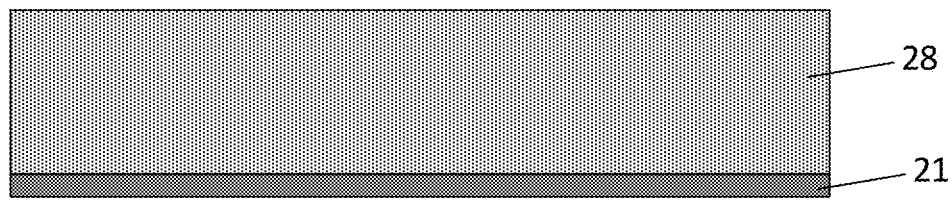

As shown in FIG. 15B, a base material 28 is applied on the base substrate 21.

For example, the base material 28 depends on the application of the micro-nano channel structure, and the base material 28 includes an insulating material, a semiconductor material, a conductive material, or any combination of the materials mentioned above. The specific components of the base material 28 refer to the related descriptions of the material of the base layer 22 mentioned above, which is omitted herein.

Figure 15C:
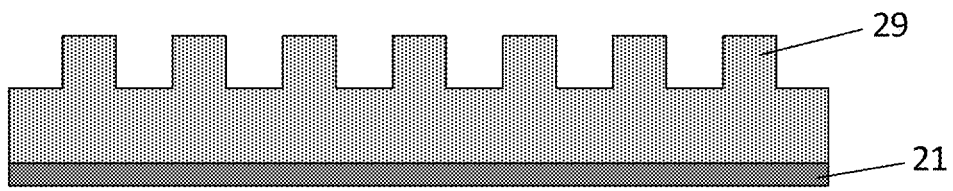
Figure 15C:
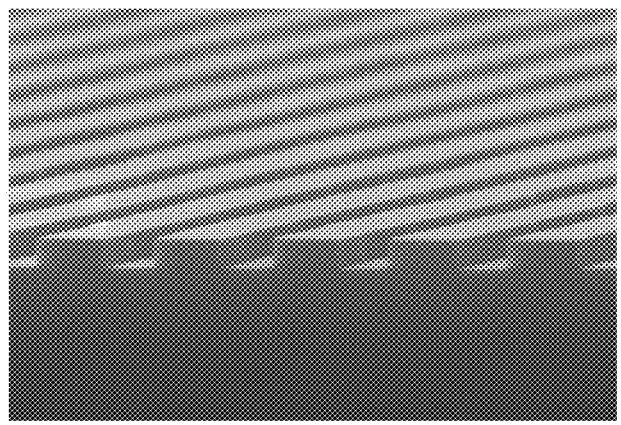

As shown in FIG. 15C, performing a treatment on the base material 28 to form a first base pattern 29.

For example, methods for performing a treatment on the base material 28 to form the first base pattern 29 include: a photolithography process, an electron beam lithography process, a nano-imprint lithography, an etching process (for example, dry etching), a thermal etching process, or any combination of the processes mentioned above.

For example, in an example, the first base pattern 29 is formed by a nano-imprint method.

For example, the nano-imprint technology requires a nano-imprint plate for imprinting, with the aid of a photoresist, a micro-nano structure on a template is transferred to the material to be processed; the nano-imprint technology is a micro-nano processing technology, and by the method of mechanical transfer, the technology can achieve ultra-high resolution, high fidelity and high yield.

For example, the nano-imprint technology is divided into three steps: (1) processing of the template, a method such as an electron beam etching method is generally used to process a required structure on silicon or other substrates to be used as the template, because a diffraction limit of the electron is much smaller than a diffraction limit of the photon, the template achieves a much higher resolution than the lithography method; (2) transferring of patterns, photoresist is applied on the surface of the material to be processed, then the template is pressed onto the surface of the photoresist, and the pattern of the template is transferred to the photoresist in a pressurized manner; (3) processing of the material to be processed, UV light is used to cure the photoresist, the template is removed to form a photoresist pattern and expose a surface of the material to be processed, then process the material by using a chemical etching method, and all the photoresist is removed after completing the processing, finally a high-precision processed material is obtained. In the process, only the manufacturing cost of the nano-imprint plate in step (1) is relatively high.

As shown in FIG. 15C, cross-sectional shapes of the protrusions in the first base pattern 29 are rectangles, sizes of the rectangles are the same, and spacings between adjacent rectangles are equal.

For example, FIG. 15C' is a schematic view of a three-dimensional structure of the first base pattern 29. It can be seen from FIG. 15 C', the three-dimensional structures of the protrusions in the first base pattern 29 are a plurality of cuboids arranged uniformly, these cuboids are equal in length, width, and height, and spacings between adjacent cuboids are also equal. In this way, the protrusions formed in the first base pattern 29 have same shape and same size.

According to different application scenarios, sometimes the sizes of the micro-nano channels formed subsequently are required to change regularly; according to the above embossing method, each time a change in the base pattern is required, it is necessary to select another imprint plate for embossing to form a new set of patterns, and all the shapes of the formed protrusions are rectangular. Thus, the use range of the micro-nano channel structure is greatly limited, and due to the high precision of the embossing plate, the price of the imprint plate is very expensive, so that the production cost is greatly increased.

Figure 15D:
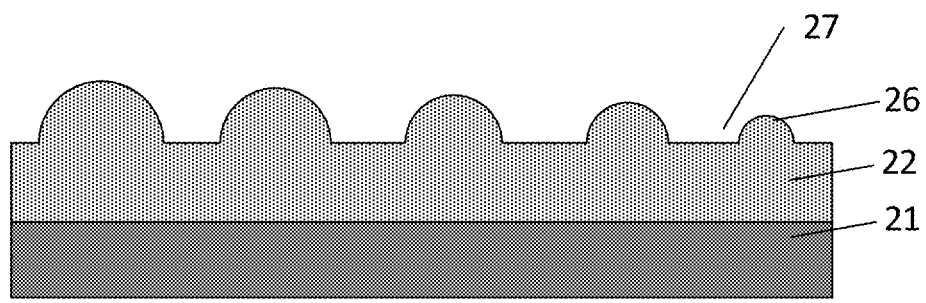

As shown in FIG. 15D, a deforming treatment is performed on the first base pattern 29 to form a base layer 22, and the base layer 22 includes a plurality of protrusions 26.

For example, performing a deforming treatment on the first base pattern 29 includes a heat treatment, a laser irradiation treatment, or a plasma bombardment treatment.

For example, the heat treatment refers to heating the first base pattern 29, so that the first base pattern 29 is deformed to form a required pattern of the base layer 22.

For example, the heating temperature is from 25° C. to 1500° C., the heating time is from 1 hour to 10 hours, the higher the temperature used for heating and the longer the heating time, the larger the deformation of the shape of the protrusions formed relative to the rectangular structure in the first base pattern 29.

For example, in an example, a heat source is located at rightmost side of the first base pattern 29; the temperature generated by the heat source is gradually decreased from the rightmost side to the leftmost side of the first base pattern 29, in this way, the temperature for heating the protrusions on the first base pattern 29 is gradually reduced from the rightmost side to the leftmost side of the first base pattern 29. In a case that the heating times are the same, the cross-sectional areas of the formed protrusions are gradually increased from the rightmost side to the leftmost side of the base layer. For example, the cross-sectional shapes of the formed protrusions are all semicircular, and the radiuses of the semi-circular protrusions are gradually increased from the rightmost side to the leftmost side of the base layer, and the structure of the finally formed base layer 22 is shown in FIG. 15D.

For example, in an example, the heat source is located in the middle of the first base pattern 29, the temperature generated by the heat source is gradually decreased from the middle of the first base pattern 29 to both left and right sides, in this way, the temperature for heating the protrusions on the first base pattern 29 is gradually reduced from the middle of the first base pattern 29 to both the left and right sides, in a case that the heating times are the same, the cross-sectional areas of the formed protrusions are gradually increased from the middle of the base layer to both the left and right sides. For example, the cross-sectional shapes of the formed protrusions are all semicircular, and the radiuses of the semicircular protrusions are gradually increased from the middle of the base layer to both the left and right sides, thus a symmetrical structure is formed.

For example, the patterns of the base layer 22 are different due to the arrangement position of the heat source, the heating temperature and the heating time. In addition to the above-mentioned arrangement, the plurality of the protrusions 26 may also be in any other designed arrangements. For example, the sizes of any two adjacent protrusions are different from each other; the plurality of the protrusions are arranged alternately between a large one and a small one; in addition, several protrusions having a first size and a first shape are arranged on a side of the base layer, and other protrusions having a second size and a second shape are arranged on another side of the base layer.

For example, the shape of the formed protrusion is a triangle or a trapezoid by changing the heating position at all times during the heating process or using a method of local heating, the specific heating condition is adjusted as requirements, which is omitted herein.

Figure 15E:
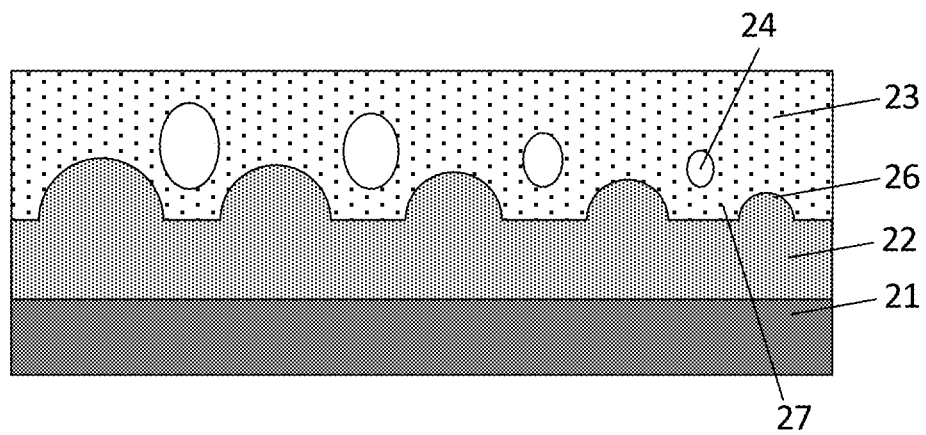

As shown in FIG. 15E, a channel wall layer 23 is formed on a side of the plurality of the protrusions 26 away from the base substrate 21; the channel wall layer 23 is provided with micro-nano channels 24, recessed portions 27 are provided between adjacent two of the plurality of the protrusions 26, and orthographic projections of the micro-nano channels 24 on the base substrate 21 are located within orthographic projections of the recessed portions 27 on the base substrate 21 respectively.

For example, the method of forming a channel wall layer includes a deposition method. For example, the deposition method includes: a sputtering method (for example, magnetron sputtering), an evaporation method (for example, a chemical vapor deposition method, and a plasma enhanced chemical vapor deposition (PECVD) method), a thermal vapor deposition method, an atomic layer deposition (ALD) method), and an electron beam evaporation method. In the following, the process of sputtering a channel wall layer material on the base layer 22 and forming the channel wall layer 23 on a side of the plurality of the protrusions 26 away from the base substrate 21 is taken as an example to explain.

For example, due to the presence of the plurality of the protrusions 26, the material of the channel wall layer is deposited at a relatively fast rate on the top of the protrusions 26, the side surfaces of the protrusions 26, and the vicinity of the protrusions 26 firstly. In this way, the material of the channel wall layer has a slower deposition speed at the recessed portions 27; as the deposition process progresses, the distance between adjacent protrusions 26 continues to decrease, adjacent protrusions 26 are finally connected by the sputtered channel wall layer material directly above the recessed portions 27 to form connection portions, and the height of the channel wall layer that is gradually sputtered directly above the recessed portions 27 does not reach the height of each of the connecting portions, so that closed micro-nano channels 24 are formed, as shown in FIG. 15E. Alternately, the thickness of the channel wall layer material deposited on each side of the recessed portions 27 are significantly larger than the thickness of the channel wall layer material directly above the recessed portions 27, in a case that the sputtering of the material of the channel wall layer is stopped before the adjacent protrusions 26 are connected by the sputtered channel wall layer material directly above the recessed portions 27, semi-closed micro-nano channels 24 having open spaces at their upper portions are formed.

By arranging the pattern of the base layer and sputtering the channel wall layer material onto the base substrate 21 to form the micro-nano channels 24, the resolution of the formed micro-nano channels 24 is not limited by the resolution of the patterning device or the etching device, and the method is suitable for various channel wall layer materials.

For example, the sputtering equipment used for depositing the channel wall layer material by the sputtering method includes: a direct-current sputtering equipment, a radio frequency sputtering equipment, a pulsed direct-current sputtering equipment, a magnetron sputtering equipment, and a pulsed direct-current magnetron sputtering equipment. The sputtering process includes: a physical sputtering and a reactive sputtering.

For example, the method of sputtering the channel wall layer material includes: placing the base layer in a sputtering chamber, and sputtering a sputtered target material to form the channel wall layer on the base layer, and the sputtered target material includes a channel wall layer material or its precursor. For example, the sputtering temperature is room temperature, the atmosphere of the sputtering includes oxygen and argon, the power of the sputtering is from 2 kw to 5 kw, the atmosphere pressure of the sputtering is from 0.05 pa to 0.8 pa, and the sputtering equipment is a magnetron sputtering equipment.

For example, the power of the sputtering is 2 kw, 3 kw, 4 kw, or 5 kw, and the atmospheric pressure of the sputtering is 0.05 pa, 0.1 pa, 0.2 pa, 0.3 pa, 0.4 pa, 0.5 pa, 0.6 pa, 0.7 pa, or 0.8 pa.

For example, the process for forming the micro-nano channel further includes: controlling the size and the shape of the micro-nano channel 24 by controlling the sputtering power of the material of the sputtering channel wall layer 23, and the principle is as follows.

The tops of the protrusions are higher than the tops of the recessed portions; in a case that the sputtering process is performed at constant sputtering power and the sputtering process is conducted above the base layer, relative to the recessed portions, the tops of the protrusions receive the sputtering material firstly, then the side surfaces of the protrusions receive the sputtering material, and finally, the recessed portions receive the sputtering material. In this way, during a same time period, the tops of the protrusions receive most of the sputtering material, the side surfaces of the protrusions receive less of the sputtering material, the recessed portions receive the least of the sputtering material, and the higher the sputtering power is, the faster the gap is widened.

If a closed micro-nano channel is eventually formed, the sputtering material received by the adjacent side surfaces of the two adjacent protrusions is connected faster; because the cross-sectional widths of the recessed portions from the side close to the base substrate to the side far away from the base substrate are getting larger and larger, the faster the sputtering material received by the adjacent side surfaces of the two adjacent protrusions is connected, the smaller the size of the formed micro-nano channel, and at the same time, the closer the cross-sectional shape of the micro-nano channel is to a circle; instead, the lower the sputtering power, the slower the sputtering material received by the adjacent side surfaces of the two adjacent protrusions is connected, the larger the cross-sectional area of the formed micro-nano channel, and at the same time, the closer the cross-sectional shape of the micro-nano channel is to the shape of a water droplet.

If a semi-closed micro-nano channel is eventually formed, the higher the sputtering power, the more sputtering material is received by the side surfaces of the protrusions, the less sputtering material is received by the recessed portions, since the cross-sectional widths of the recessed portions from the side close to the base substrate to the side far away from the base substrate are getting larger and larger, thus the larger the cross-sectional area of the semi-closed micro-nano channel is formed, and at the same time, the more the semi-closed micro-nano channel's cross-sectional shape deviates from the semi-circular shape; instead, the lower the sputtering power, the smaller the difference between the amount of the sputtering material received by the adjacent side surfaces of the two adjacent protrusions and the amount of the sputtering material received by the recessed portion, thus the closer the cross-sectional shape of the formed semi-closed micro-nano channel is to the semi-circular shape.

For example, the manufacturing method further includes: by controlling the sputtering duration of the channel wall layer material to control both the size and the shape of the micro-nano channel 24.

For example, at the same sputtering power, the longer the time for sputtering the channel wall layer material, the greater the difference between the amount of the sputtering material received by the adjacent side surfaces of the two adjacent protrusions and the amount of the sputtering material received by the recessed portions, the easier the closed micro-nano channels is formed, for example, the cross-sectional shape of the closed micro-nano channel is circular or in a water droplet shape; if the time for sputtering the channel wall layer material is too short to make the sputtering materials received by the respectively adjacent side surfaces of the two adjacent protrusions connect to each other, then a semi-closed micro-nano channel is formed.

For example, in an example, both the number of the recessed portions 27 and the number of the micro-nano channels 24 are multiple, in this way, in the process of processing the first base pattern, the maximum widths of the adjacent recessed portions 27 in the plane substantially perpendicular to the extending direction of the recessed portions 27, are different from each other, and the heights of the adjacent protrusions 26 of the plurality of the protrusions 26 in the plane substantially perpendicular to the extending direction of the recessed portions 27 are different from each other, so that the sizes of the cross-sectional areas of the adjacent micro-nano channels 24 are different from each other.

According to various requirements in practical applications, the high-resolution or ultra-high resolution micro-nano channel structures with different cross-sectional areas can be manufactured by the above manufacturing methods, at the same time, the production cost is saved and the production efficiency is increased.

For example, FIG. 16A to FIG. 16D are process diagrams for manufacturing a micro-nano channel structure provided by an embodiment of the present disclosure. The manufacturing process of the micro-nano channel structure is described in detail below according to FIG. 16A to FIG. 16D.

Figure 16A:
FIG. 16A to FIG. 16D are process diagrams for manufacturing a micro-nano channel structure provided by an embodiment of the present disclosure.

As shown in FIG. 16A, a base substrate 21 is provided.

Figure 16B:
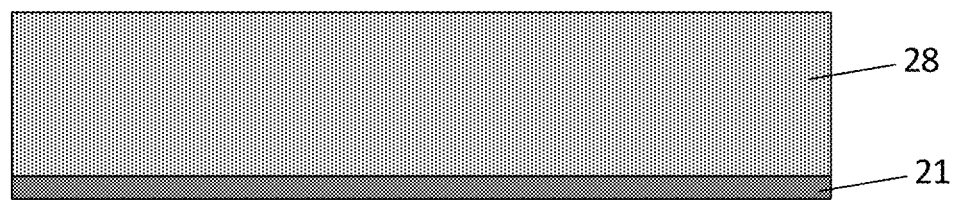

As shown in FIG. 16B, a base material 28 is applied on the base substrate 21.

Figure 16C:
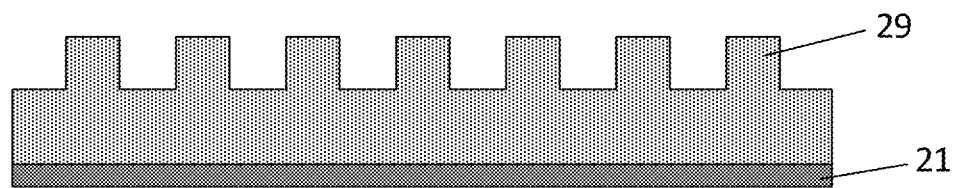

As shown in FIG. 16C, performing a treatment on the base material 28 to form a first base pattern 29.

For example, the forming process of the first base pattern 29 refers to the related descriptions mentioned above, which is omitted herein.

Figure 16D:
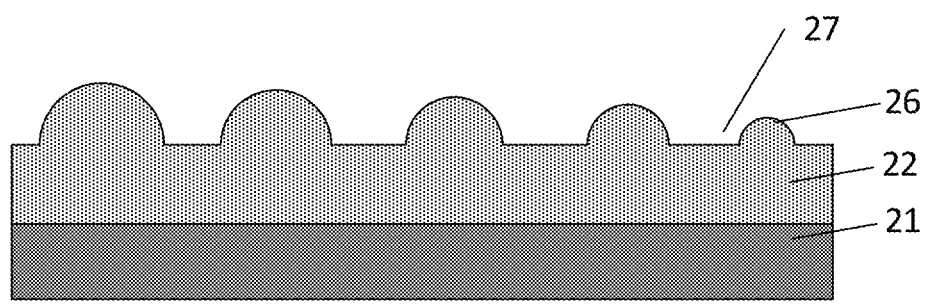

As shown in FIG. 16D, the channel wall layer material is sputtered on the first base pattern 29 and then the first base pattern 29 is subjected to a deforming treatment, at the same time, a channel wall layer 23 is formed on a side of the plurality of the protrusions 26 away from the base substrate 21; the channel wall layer 23 is provided with micro-nano channels 24, recessed portions 27 are provided between adjacent two of the plurality of the protrusions 26, and orthographic projections of the micro-nano channels 24 on the base substrate 21 are located within orthographic projections of the corresponding recessed portions 27 on the base substrate 21 respectively.

For example, the material of the channel wall layer, the method for manufacturing the channel wall layer, and the methods for controlling the formation of the micro-nano channels, refer to the related descriptions mentioned above, which is omitted herein.

For example, the principle of deforming the first base pattern while forming the channel wall layer is: heat is generated in the process of depositing the channel wall layer material, and the heat causes the first base pattern to deform so as to form the base layer.

For example, in the process of forming the channel wall layer, if the magnetron sputtering is used, though the sputtering is performed at room temperature, the power of the magnetron sputtering equipment is high, in this way, higher energy is generated, so that in a case that the material is deposited on the base layer, the temperature of the channel wall layer material reaches about 200° C., and the temperature causes the first base pattern to deform, thus at least the cross-sectional shape of at least a portion of the protrusions are non-rectangular; if the vapor deposition method (for example, a chemical vapor deposition method, a plasma enhanced chemical vapor deposition (PECVD)), the thermal vapor deposition method, the atomic layer deposition (ALD) method, and the electron beam evaporation method are used to form the channel wall layer, higher energy is also generated, so that the first base pattern deforms, and the cross-sectional shape of at least a portion of the protrusions is non-rectangular. In this way, micro-nano channels with high resolution or ultra-high resolution and with different sizes and shapes can be manufactured, which are suitable for different requirements in practical applications, at the same time the process steps are saved and the production cost is saved.

At least one embodiment of the present disclosure further provides a method for manufacturing a sensor, and the manufacturing method includes: forming a sensing circuit and any one of the micro-nano channel structures mentioned above.

For example, in a case that the protrusions in the micro-nano channel structure are made of an insulating material or a semiconductor material, or in a case that even if the material of the protrusions in the micro-nano channel structure is a conductive material, but the protrusions made from the conductive material are not used as electrodes of the sensor, the method for manufacturing the sensor includes: forming the sensing circuit and the electrodes of the sensor on the base substrate, and after the electrodes are formed, forming one or more micro-nano channel structures directly on the electrodes.

For example, the steps of forming one or more micro-nano channel structures include: providing a base substrate; applying a base material on the base substrate; performing a treatment on the base material to form a base layer, in which the base layer comprises a plurality of protrusions; forming a channel wall layer on a side of the plurality of the protrusions away from the base substrate, in which the channel wall layer is provided with one or more micro-nano channels, one or more recessed portions is/are provided between adjacent protrusions of the plurality of the protrusions, and orthographic projection(s) of the one or more micro-nano channels on the base substrate is/are located within orthographic projection(s) of the one or more recessed portions on the base substrate.

For example, the method for forming the one or more micro-nano channel structures and the method for controlling the size and shape of the one or more micro-nano channel structures refer to the related descriptions mentioned above, which is omitted herein.

For example, in a case that the base layer in the micro-nano channel structure is made of the conductive material and the plurality of the protrusions are sensing electrodes of the sensor, the method for manufacturing the sensor includes: forming the sensing circuit and one or more micro-nano channel structures on the base substrate, in this way, the plurality of the protrusions made of the conductive material can be used as a sensing electrode for detecting target gas molecules absorbed on the inner surface of the micro-nano channel(s).

For example, the micro-nano channel structure is used as a gas sensor for detecting gas. Due to the existence of micro-nano channel structure, the gas sensor is provided with a large surface area for absorbing target gas molecules, so that the gas sensor has a higher sensitivity. For example, for a closed micro-nano channel, the target gas molecules flows into the closed micro-nano channel from the openings at both ends of the micro-nano channel, so that the target gas molecules are adsorbed on the inner surface of the micro-nano channel. For example, the semi-closed micro-nano channel is open on the side away from the base substrate, the target gas molecules flows into the semi-closed micro-nano channel from the open side of the semi-closed micro-nano channel, so that the target gas molecules are adsorbed on the inner surface of the micro-nano channel.

The micro-nano channel structure, the method for manufacturing the micro-nano channel structure, the sensor, the method for manufacturing the sensor, and the microfluidic device provided by at least one embodiment of the present disclosure have at least one of the following beneficial effects:

(1) In the micro-nano channel structure provided by at least one embodiment of the present disclosure, according to the requirements, the shape of the protrusions on the base layer can be made in various shapes, the sizes of the protrusions can be changed as requirements, then the size and the shape of the formed micro-nano channel(s) can be controlled according to the deposition conditions of the subsequent channel wall layer.

(2) In the micro-nano channel structure provided by at least one embodiment of the present disclosure, the micro-nano channel can be formed as a closed micro-nano channel or a non-closed micro-nano channel, which is adapted to the requirements of more applications.

(3) In the sensor provided by at least one embodiment of the present disclosure, the base layer included in the micro-nano channel structure is made of the conductive material, the plurality of the protrusions in the base layer are the electrodes of the sensor, and the electrodes of the sensor are configured to detect at least one of the chemical signal and the biological signal in the micro-nano channel.

(4) In the microfluidic device provided by at least one embodiment of the present disclosure, the base layer formed of the conductive material can be used as an electrode of the microfluidic device, such as a control electrode, a grid electrode, and so on.

The following points required to be explained:

(1) the drawings of the embodiments of the present disclosure only relate to the structures related to the embodiments of the present disclosure, and other structures can refer to the general design.

(2) for the sake of clarity, in the drawings used to describe the embodiments of the present disclosure, the thickness of layers or areas is enlarged or reduced, that is, the drawings are not drawn according to the actual scale. It is understood that in the case that an element such as a layer, membrane, region, or substrate is referred to as being "up" or "down" on another element, the element may be "directly" on "or" down "on another element or there may be intermediate elements.

(3) without conflict, the embodiments of the present disclosure and the features in the embodiments may be combined with each other to obtain new embodiments.

What is described above is related to only the illustrative embodiments of the present disclosure and not limitative to the protection scope of the present application. Thus, the protection scope of the present application shall be defined by the accompanying claims.

What is claimed is:

1. A micro-nano channel structure, comprising:
   a base substrate;
   a base layer, on the base substrate and comprising a plurality of protrusions; and
   a plurality of micro-nano channels,
   wherein at least one of the micro-nano channels is at a side of the base layer away from the base substrate;
   on a plane roughly perpendicular to a main surface of the base substrate, a maximum distance between the micro-nano channels and the base substrate is greater than a maximum distance between the protrusions and the base substrate;
   a recessed portion is provided between adjacent protrusions in the plurality of protrusions, on a plane roughly perpendicular to an extension direction of the recessed portion, a cross-sectional shape of each of the protrusions is semi-circular.

2. The micro-nano channel structure according to claim 1, wherein the micro-nano channels are located in a channel wall layer, and the channel wall layer is located on a side of the base layer away from the base substrate.

3. The micro-nano channel structure according to claim 2, wherein orthographic projections of the plurality of protrusions on the base substrate roughly extend along a first direction.

4. The micro-nano channel structure according to claim 3, wherein an extension direction of orthographic projections of the plurality of micro-nano channels on the base substrate is roughly parallel to an extension direction of orthographic projections of the plurality of protrusions on the base substrate.

5. The micro-nano channel structure according to claim 1, wherein an extension direction of orthographic projections of the plurality of protrusions on the base substrate is roughly parallel to an extension direction of orthographic projections of a plurality of recessed portions on the base substrate.

6. The micro-nano channel structure according to claim 5, wherein orthographic projections of the plurality of the micro-nano channels on the base substrate are located within orthographic projections of adjacent protrusions of the plurality of the protrusions.

7. The micro-nano channel structure according to claim 2, wherein cross-sectional areas of the micro-nano channels in a plane parallel to the main surface of the base substrate first increases and then decreases with a relative distance to the base substrate from near to far.

8. The micro-nano channel structure according to claim 7, wherein cross-sectional areas of the micro nano channels in the plane parallel to the main surface of the base substrate increases by a greater magnitude than a smaller magnitude as the relative distance to the base substrate increases from near to far.

9. The micro-nano channel structure according to claim 2, wherein a surface of the channel wall layer close to the base substrate is in direct contact with the base layer.

10. The micro-nano channel structure according to claim 9, wherein a gap is provided between the surface of the channel wall layer close to the base substrate and at least one of the protrusions.

11. The micro-nano channel structure according to claim 9, wherein a plurality of valleys roughly extending in a first direction are provided on a surface of the channel wall layer away from the base substrate.

12. The micro-nano channel structure according to claim 5, wherein a cross-sectional shape of at least one of the micro-nano channels on a plane roughly perpendicular to the extension direction of the micro-nano channels and perpendicular to the main surface of the base substrate is an axisymmetric pattern;
a cross-sectional shape of at least one of the recessed portions on the plane roughly perpendicular to the extension direction of the recessed portions and perpendicular to the main surface of the base substrate is an axisymmetric pattern;
a symmetry axis of at least one micro-nano channels on a plane roughly perpendicular to the extension direction of the micro-nano channels and perpendicular to the main surface of the base substrate is collinear with a symmetry axis of the at least one of the recessed portions on the plane roughly perpendicular to the extension direction of the micro-nano channels and perpendicular to the main surface of the base substrate.

13. The micro-nano channel structure according to claim 11, wherein a symmetry axis of at least one valleys on the plane roughly perpendicular to the extension direction of the micro-nano channels and perpendicular to the main surface of the base substrate, the symmetry axis of at least one micro-nano channels on the plane roughly perpendicular to the extension direction of the micro-nano channels and perpendicular to the main surface of the base substrate are collinear with the symmetry axis of at least one recessed portions on the plane roughly perpendicular to the extension direction of the micro-nano channels and perpendicular to the main surface of the base substrate.

14. A micro-nano channel structure, comprising:
a base substrate;
a base layer, on the base substrate and comprising a plurality of protrusions; and
a plurality of micro-nano channels, wherein at least one of the micro-nano channels is at a side of the base layer away from the base substrate, wherein
a recessed portion is provided between adjacent protrusions in the plurality of protrusions, on a plane roughly perpendicular to an extension direction of the recessed portion, a cross-sectional shape of each of the protrusions is semi-circular.

15. The micro-nano channel structure according to claim 14, wherein the micro-nano channels are located in a channel wall layer, and the channel wall layer is located on a side of the base layer away from the base substrate;
orthographic projections of the plurality of micro-nano channels on the base substrate roughly coincides with orthographic projections of recessed portions on the base substrate;
the orthographic projections of the plurality of micro-nano channels on the base substrate overlap or do not overlap with the orthographic projections of the protrusions on the base substrate.

16. The micro-nano channel structure according to claim 15, wherein the protrusions are smoothly connected to the recessed portions.

17. A micro-nano channel structure, comprising:
a base substrate;
a base layer, on the base substrate and comprising a plurality of protrusions, the plurality of protrusions roughly extend along a first direction; and
a plurality of micro-nano channels, wherein orthographic projections of the plurality of micro-nano channels on a plane perpendicular to a main surface of the base substrate and roughly parallel to the first direction overlap or do not overlap with orthographic projections of corresponding adjacent protrusions on the plane perpendicular to the main surface of the base substrate and roughly parallel to the first direction;
a recessed portion is provided between adjacent protrusions in the plurality of protrusions, on a plane roughly perpendicular to an extension direction of the recessed portion, a cross-sectional shape of each of the protrusions is semi-circular.

18. The micro-nano channel structure according to claim 17, wherein the micro-nano channels are located in a channel wall layer, and the channel wall layer is located on a side of the base layer away from the base substrate.

19. The micro-nano channel structure according to claim 18, wherein an orthographic projection of the micro-nano channel on the base substrate roughly coincides with an orthographic projection of a corresponding recessed portion on the base substrate.

* * * * *